(12) United States Patent
Hirano et al.

(10) Patent No.: US 10,505,087 B2
(45) Date of Patent: Dec. 10, 2019

(54) METHOD FOR MANUFACTURING NITRIDE SEMICONDUCTOR ULTRAVIOLET LIGHT-EMITTING ELEMENT AND NITRIDE SEMICONDUCTOR ULTRAVIOLET LIGHT-EMITTING ELEMENT

(71) Applicant: Soko Kagaku Co., Ltd., Ishikawa (JP)

(72) Inventors: Akira Hirano, Aichi (JP); Yosuke Nagasawa, Ishikawa (JP)

(73) Assignee: SOKO KAGAKU CO., LTD., Ishikawa (JP)

( * ) Notice: Subject to any disclaimer, the term of this patent is extended or adjusted under 35 U.S.C. 154(b) by 0 days.

(21) Appl. No.: 15/772,612

(22) PCT Filed: Aug. 24, 2017

(86) PCT No.: PCT/JP2017/030282
§ 371 (c)(1),
(2) Date: May 1, 2018

(87) PCT Pub. No.: WO2019/038877
PCT Pub. Date: Feb. 28, 2019

(65) Prior Publication Data
US 2019/0123249 A1 Apr. 25, 2019

(51) Int. Cl.
*H01L 33/58* (2010.01)
*H01L 33/32* (2010.01)
(Continued)

(52) U.S. Cl.
CPC ............. *H01L 33/58* (2013.01); *H01L 33/20* (2013.01); *H01L 33/32* (2013.01); *H01L 33/56* (2013.01);
(Continued)

(58) Field of Classification Search
CPC .......... H01L 33/58; H01L 33/56; H01L 33/20; H01L 33/60; H01L 33/32; H01L 33/007;
(Continued)

(56) References Cited

U.S. PATENT DOCUMENTS 5,831,277 A * 11/1998 Razeghi ................. B82Y 20/00
257/15
2005/0023545 A1 2/2005 Camras et al.
(Continued)

FOREIGN PATENT DOCUMENTS

JP 11191636 7/1999
JP 2004289047 10/2004
(Continued)

OTHER PUBLICATIONS

Ichikawa et al., "High-output-power deep ultraviolet light-emitting diode assembly using direct bonding," Applied Physics Express 9, Jun. 1, 2016, 4 pages.
(Continued)

*Primary Examiner* — Syed I Gheyas
(74) *Attorney, Agent, or Firm* — Haynes Beffel & Wolfeld LLP

(57) ABSTRACT

A nitride semiconductor ultraviolet light-emitting element 1 comprises a sapphire substrate 10 and an element structure part 20 formed on a main surface 101 of the substrate 10. In the substrate 10, in a first portion 110 extending from the main surface 101 by a first distance, a sectional area of a cross section parallel to the main surface 101 continuously increases with distance from the main surface 101, and in a second portion 120 extending from a side opposite to the main surface 101 by a second distance, a sectional area of a cross section parallel to the main surface 101 continuously increases with distance from the side opposite to the main surface 101. The sum of the first distance and the second
(Continued)

distance is equal to or less than the thickness of the substrate 10.

15 Claims, 12 Drawing Sheets

(51) Int. Cl.
*H01L 33/60* (2010.01)
*H01L 33/20* (2010.01)
*H01L 33/56* (2010.01)
*H01L 33/00* (2010.01)
*H01L 33/44* (2010.01)

(52) U.S. Cl.
CPC ............ *H01L 33/60* (2013.01); *H01L 33/007* (2013.01); *H01L 33/44* (2013.01); *H01L 2933/005* (2013.01); *H01L 2933/0025* (2013.01); *H01L 2933/0058* (2013.01)

(58) Field of Classification Search
CPC ............... H01L 33/44; H01L 2933/005; H01L 2933/0058; H01L 2933/0025
See application file for complete search history.

(56) References Cited

U.S. PATENT DOCUMENTS

| | | | |
|---|---|---|---|
| 2007/0105258 A1* | 5/2007 | Yoshida | C30B 29/403 438/46 |
| 2009/0239318 A1 | 9/2009 | Nakamura et al. | |
| 2010/0084745 A1* | 4/2010 | Meguro | C30B 25/02 257/618 |
| 2011/0068434 A1* | 3/2011 | Yamaguchi | C30B 29/406 257/615 |
| 2011/0220868 A1 | 9/2011 | Choi et al. | |
| 2013/0153947 A1 | 6/2013 | Lim et al. | |
| 2015/0311249 A1 | 10/2015 | Weng et al. | |
| 2016/0149099 A1 | 5/2016 | Shatalov et al. | |
| 2016/0201875 A1 | 7/2016 | Kang et al. | |
| 2017/0186600 A1* | 6/2017 | Ostermaier | H01L 21/02381 |
| 2017/0263817 A1 | 9/2017 | Hirano et al. | |

FOREIGN PATENT DOCUMENTS

| | | |
|---|---|---|
| JP | 2006035334 | 2/2006 |
| JP | 2006093686 A | 4/2006 |
| JP | 2007150232 | 6/2007 |
| JP | 2008168358 | 7/2008 |
| JP | 2015015281 | 1/2015 |
| JP | 2016127030 A | 7/2016 |
| JP | 2015-057266 | 10/2016 |
| KR | 20110101572 A | 9/2011 |
| TW | 201342658 A | 10/2013 |
| TW | M512219 U | 11/2015 |
| WO | 2008041771 | 4/2008 |
| WO | 2016157518 | 10/2016 |

OTHER PUBLICATIONS

EP Extended European Search Report from EP 17868513.7, dated Jul. 24, 2019, 7 pages.

* cited by examiner

METHOD FOR MANUFACTURING NITRIDE SEMICONDUCTOR ULTRAVIOLET LIGHT-EMITTING ELEMENT AND NITRIDE SEMICONDUCTOR ULTRAVIOLET LIGHT-EMITTING ELEMENT

TECHNICAL FIELD

The present invention relates to a nitride semiconductor ultraviolet light-emitting element in which AlGaN-based semiconductor layers are formed on the main surface of a sapphire substrate and emitting light whose central emission wavelength is 365 nm or less (ultraviolet light), and a method for manufacturing the same.

BACKGROUND ART

In a nitride semiconductor ultraviolet light-emitting element such as an LED (Light Emitting Diode) or an LD (Laser Diode) in which AlGaN-based semiconductor layers are formed on the main surface of a sapphire substrate, a lens may be provided for the purpose of increasing light extraction efficiency and the like.

For example, Non-Patent Document 1 proposes a nitride semiconductor ultraviolet light-emitting element in which a hemispherical lens is bonded to the rear surface on the side opposite to the main surface (the surface where an element structure part that emits light upon energization is formed) of a sapphire substrate.

Further, for example, Patent Document 1 proposes a light-emitting element in which the rear surface and the side surface of a sapphire substrate are sealed with a glass material whose surface shape is a spherical surface. Note that, the glass material employed in the light-emitting element proposed by Patent Document 1 is mainly composed of $TeO_2$, which withstands ultraviolet light and blue-color light, but is greater in refractive index than sapphire.

PRIOR ART DOCUMENTS

Patent Document

Patent Document 1: Japanese Patent Application Publication NO. 2007-150232

Non-Patent Document

Non-Patent Document 1: Masatsugu Ichikawa et al., "High-output-power deep ultraviolet light-emitting diode assembly using direct bonding", Applied Physics Express 9, 072101 (2016)

SUMMARY OF THE INVENTION

Problems to be Solved by the Invention

While the nitride semiconductor ultraviolet light-emitting element proposed by Non-Patent Document 1 necessitates bonding of the substrate and the lens to each other, any layer that influences traveling of light emitted from the element structure part or any layer that deteriorates from light emitted from the element structure part (particularly, ultraviolet light) must not be provided between the substrate and the lens. Accordingly, with the nitride semiconductor ultraviolet light-emitting element proposed by Non-Patent Document 1, a special bonding method called ADB (Atomic Diffusion Bonding) or SAB (Surface Activated Bonding) must be employed for bonding the substrate and the lens to each other. However, ADB and SAB not only require provision of a special environment, that is, vacuum of at least ultrahigh vacuum, but also provision of a special surface state where bonding is established just by contact under the foregoing environment. Thus, since ADB and SAB require special apparatuses and high-level techniques, they cannot be easily practiced.

Further, the refractive index of a glass material used in the light-emitting element proposed in Patent Document 1 is about 2.0, while the refractive index of sapphire is about 1.8, and the refractive index of air is about 1.0. When a lens is formed using a glass material whose refractive index is greater than sapphire as with the light-emitting element proposed by Patent Document 1, due to an increased refractive index difference between the lens and the air, interface reflection in extracting light from the lens into the air increases, which disadvantageously hinders an improvement of the light extraction efficiency. That is, provision of the lens in an attempt to improve the light extraction efficiency is unfortunately canceled out by the interface reflection in extracting light from the lens into the air.

The present invention provides a nitride semiconductor ultraviolet light-emitting element that can be manufactured with ease and is capable of effectively improving the light extraction efficiency, and a method for manufacturing the same.

Means for Solving the Problem

In order to achieve the object stated above, the present invention provides a method for manufacturing a nitride semiconductor ultraviolet light-emitting element, comprising a substrate processing step of subjecting a sapphire substrate of a chip to a grinding process, the chip including the sapphire substrate, and an element structure part including a plurality of AlGaN-based semiconductor layers stacked on a main surface of the substrate, the element structure part emitting light whose central emission wavelength is 365 nm or less upon energization, wherein the substrate processing step is a step of performing a grinding process on at least four corners of the main surface and four corners of a rear surface being a surface opposite to the main surface.

The method for manufacturing a nitride semiconductor ultraviolet light-emitting element makes it possible to obtain a nitride semiconductor ultraviolet light-emitting element having a lens by the simple technique of subjecting the substrate to a grinding process, without the necessity of employing a high-level technique of bonding a substrate and a lens to each other (see Non-Patent Document 1). Further, in the method for manufacturing a nitride semiconductor ultraviolet light-emitting element, the sapphire substrate is used as a lens, in contrast to the light-emitting element proposed by Patent Document 1 in which a glass material greater in refractive index than sapphire is used as a lens. This minimizes interface reflection in extracting light into the air.

Further, preferably, in the method for manufacturing a nitride semiconductor ultraviolet light-emitting element, the grinding process step is a step of performing a grinding process on at least the four corners of the main surface and the four corners of the rear surface to each become a convex curved surface.

The method for manufacturing a nitride semiconductor ultraviolet light-emitting element makes it possible to further increase the incident angle of light emitted from the element structure part and reaching the side circumferential surface near the main surface of the substrate, and to further reduce the incident angle of light emitted from the element structure part and reaching the side circumferential surface near the rear surface of the substrate. Therefore, a greater amount of light is extracted from the side opposite to the main surface.

Further, preferably, in the method for manufacturing a nitride semiconductor ultraviolet light-emitting element, the grinding process step is a step of performing a grinding process on the substrate so as to leave a surface parallel to the main surface on the rear surface side.

The method for manufacturing a nitride semiconductor ultraviolet light-emitting element makes it possible to manufacture a nitride semiconductor ultraviolet light-emitting element through an isotropic grinding process capable of achieving volume production.

Further, preferably, in the method for manufacturing a nitride semiconductor ultraviolet light-emitting element, the substrate processing step is a step of performing a grinding process on the substrate so that a shape of the substrate in a plan view as seen in a direction perpendicular to the main surface becomes one of a circle, an oval, and a quadrangle having four rounded corners.

The method for manufacturing a nitride semiconductor ultraviolet light-emitting element makes it possible to obtain a nitride semiconductor ultraviolet light-emitting element capable of reducing loss of light at the side surface of the substrate (transmission of light at the side surface near the main surface, total reflection of light at the side surface near the rear surface).

Further, preferably, in the method for manufacturing a nitride semiconductor ultraviolet light-emitting element, the substrate processing step includes a first step of forming a protective member on the chip so as to cover a surface of the element structure part, a second step of performing a grinding process on the substrate of the chip provided with the protective member, and a third step of removing the protective member after the second step.

The method for manufacturing a nitride semiconductor ultraviolet light-emitting element makes it possible to subject the substrate to the grinding process while the element structure part is being protected by the protective member.

Further, preferably, in the method for manufacturing a nitride semiconductor ultraviolet light-emitting element, in the second step, in a container having a concave curved surface to which abrasive grains are attached, at least one piece of the chip is caused to roll so as to collide with the concave curved surface.

In the method for manufacturing a nitride semiconductor ultraviolet light-emitting element, since just the corners of the chip collide with the concave curved surface and ground, the side surface of the substrate is efficiently processed to become a spherical surface. Further, by causing the chip to roll, an isotropic grinding process of the chip is achieved. Further, in the method for manufacturing a nitride semiconductor ultraviolet light-emitting element, a plurality of chips can be set in the container so as to be simultaneously subjected to the grinding process and, therefore, volume production of the nitride semiconductor ultraviolet light-emitting element is achieved.

Further, preferably, in the method for manufacturing a nitride semiconductor ultraviolet light-emitting element, before the second step is performed, when a length of one side of the main surface of the substrate being square is L, and a diameter of a circumcircle of the element structure part is R, a thickness D of the substrate satisfies:

$$D \leq 2 \times \sqrt{\left(\frac{L}{2}\right)^2 - \left(\frac{R}{2}\right)^2}$$

The method for manufacturing a nitride semiconductor ultraviolet light-emitting element makes it possible to grind the side surface of the substrate to be a spherical surface while the element structure part is being prevented from the grinding.

Further, preferably, in the method for manufacturing a nitride semiconductor ultraviolet light-emitting element, in the third step, the protective member is removed by being dissolved in a solvent.

The method for manufacturing a nitride semiconductor ultraviolet light-emitting element makes it possible to remove the protective member without applying excessive stress to the element structure part. That is, the element structure part 20 is prevented from being broken.

Further, preferably, the method for manufacturing a nitride semiconductor ultraviolet light-emitting element further comprises a transmissive member forming step of forming, on at least part of or an entire surface exposed at the four corners of the rear surface of the substrate by the grinding process in the substrate processing step, a transmissive member having an outermost surface composed of amorphous fluororesin and transmitting light emitted from the element structure part.

The method for manufacturing a nitride semiconductor ultraviolet light-emitting element makes it possible to obtain a nitride semiconductor ultraviolet light-emitting element capable of minimizing reflection of light at the side circumferential surface near the rear surface of the substrate.

Further, preferably, in the method for manufacturing a nitride semiconductor ultraviolet light-emitting element, the substrate processing step is a step of performing a grinding process on the four corners of the rear surface so as to leave part of the rear surface being parallel to the main surface and flat, and the transmissive member forming step includes a step of forming an antireflection layer on at least the rear surface, and a step of forming the amorphous fluororesin on a surface of the antireflection layer.

The method for manufacturing a nitride semiconductor ultraviolet light-emitting element makes it possible to obtain a nitride semiconductor ultraviolet light-emitting element with which at least light reaching the rear surface is effectively extracted.

Further, preferably, the method for manufacturing a nitride semiconductor ultraviolet light-emitting element further comprises a reflective member forming step of forming, on at least the surface exposed at the four corners of the main surface of the substrate by the grinding process in the substrate processing step, a reflective member reflecting light emitted from the element structure part.

The method for manufacturing a nitride semiconductor ultraviolet light-emitting element makes it possible to obtain a nitride semiconductor ultraviolet light-emitting element capable of facilitating reflection of light at the side circumferential surface on the main surface side of the substrate.

Further, the present invention provides a nitride semiconductor ultraviolet light-emitting element, comprising: a sapphire substrate; and an element structure part including a plurality of AlGaN-based semiconductor layers stacked on a main surface of the substrate, the element structure part emitting light whose central emission wavelength is 365 nm or less upon energization, wherein, in the substrate, in a first portion extending from the main surface by a first distance, a sectional area of a cross section parallel to the main surface continuously increases with distance from the main surface, in a second portion extending from a side opposite to the main surface by a second distance, a sectional area of a cross section parallel to the main surface continuously increases with distance from the side opposite to the main surface, and a sum of the first distance and the second distance is equal to or less than a thickness of the substrate.

This nitride semiconductor ultraviolet light-emitting element can be obtained through the simple technique of processing the substrate, without the necessity of employing a high-level technique of bonding the substrate and the lens to each other (see Non-Patent Document 1). Further, the nitride semiconductor ultraviolet light-emitting element uses the sapphire substrate as a lens, in contrast to the light-emitting element proposed by Patent Document 1 in which a glass material greater in refractive index than sapphire is employed as a lens. This minimizes interface reflection in extracting light into the air.

Further, in the nitride semiconductor ultraviolet light-emitting element, preferably, in the first portion, a unit increase amount of the sectional area of the cross section parallel to the main surface at a unit distance in a direction distancing from the main surface continuously reduces with distance from the main surface, and in the second portion, a unit increase amount of the sectional area of the cross section parallel to the main surface at a unit distance in a direction distancing from the main surface continuously reduces with distance from the side opposite to the main surface.

With the nitride semiconductor ultraviolet light-emitting element, the side circumferential surface of the first portion and that of the second portion of the substrate each become a convex curved surface. This further increases the incident angle of light emitted from the element structure part and reaching the side circumferential surface of the first portion of the substrate, and further reduces the incident angle of light emitted from the element structure part and reaching the side circumferential surface of the second portion of the substrate. Therefore, a greater amount of light is extracted from the side opposite to the main surface.

Further, in the nitride semiconductor ultraviolet light-emitting element, preferably, on the side opposite to the main surface of the substrate, a surface parallel to the main surface exists.

This nitride semiconductor ultraviolet light-emitting element can be manufactured through an isotropic grinding process capable of achieving volume production.

Further, in the nitride semiconductor ultraviolet light-emitting element, preferably, a shape of the substrate is one of a circle, an oval, and a quadrangle having four rounded corners in a plan view as seen in a direction perpendicular to the main surface.

This nitride semiconductor ultraviolet light-emitting element is capable of reducing loss of light at the side surface of the substrate (transmission of light at the side surface of the first portion, total reflection of light at the side surface of the second portion).

Further, in the nitride semiconductor ultraviolet light-emitting element, preferably, a transmissive member having an outermost surface composed of amorphous fluororesin and transmitting light emitted from the element structure part is formed on at least part of or an entire side circumferential surface of the second portion of the substrate.

This nitride semiconductor ultraviolet light-emitting element minimizes reflection of light at the side circumferential surface of the second portion of the substrate.

Further, in the nitride semiconductor ultraviolet light-emitting element, preferably, a rear surface being a flat surface parallel to the main surface exists on the side opposite to the main surface of the substrate, the transmissive member being formed on part of or the entire rear surface, and the transmissive member includes an antireflection layer formed on at least the rear surface.

With this nitride semiconductor ultraviolet light-emitting element, at least light reaching the rear surface is effectively extracted.

Further, in the nitride semiconductor ultraviolet light-emitting element, preferably, a reflective member reflecting light emitted from the element structure part is formed on at least part of a side circumferential surface of the first portion of the substrate.

This nitride semiconductor ultraviolet light-emitting element facilitates reflection of light at the side circumferential surface of the first portion of the substrate.

Effect of the Invention

The method for manufacturing a nitride semiconductor ultraviolet light-emitting element according to each of the aspects described above makes it possible to easily manufacture, through a simple technique of subjecting a substrate to a grinding process, a nitride semiconductor ultraviolet light-emitting element with which the light extraction efficiency is effectively improved by virtue of minimized interface reflection in extracting light into the air.

Further, with the nitride semiconductor ultraviolet light-emitting element according to each of the aspects described above, the light extraction efficiency is effectively improved by virtue of minimized interface reflection in extracting light into the air. Further, the nitride semiconductor ultraviolet light-emitting element according to each of the aspects can be easily manufactured just by processing the substrate.

DESCRIPTION OF EMBODIMENT

In the following, a description will be given of an embodiment of the present invention, exemplarily as a nitride semiconductor ultraviolet light-emitting element being a light-emitting diode including a sapphire substrate and an element structure part having a plurality of AlGaN-based semiconductor layers stacked on a main surface of the substrate and emitting light (ultraviolet ray) whose central emission wavelength is 365 nm or less upon energization, and a method for manufacturing the same. Here, an AlGaN-based semiconductor being the material of the layers of the AlGaN-based semiconductor layers is basically a ternary or binary compound semiconductor expressed by a general formula $Al_xGa_{1-x}N$ (where x is the molar fraction of AlN, $0 \leq x \leq 1$), and is a Group-III nitride semiconductor whose bandgap energy is equal to or greater than the bandgap energy of GaN (x=0) (about 3.4 eV). So long as the foregoing condition regarding the bandgap energy is satisfied, a small amount of In or the like may be contained.

Note that, the nitride semiconductor ultraviolet light-emitting element and the method for manufacturing the same of the present invention mainly relate to the shape of the substrate and a method for processing the substrate. Therefore, the element structure part may have any structure, without being limited to the structure of the element structure part of the nitride semiconductor ultraviolet light-emitting element exemplarily shown in the following.

<Exemplary Structure of Nitride Semiconductor Ultraviolet Light-Emitting Element>

Figure 1:
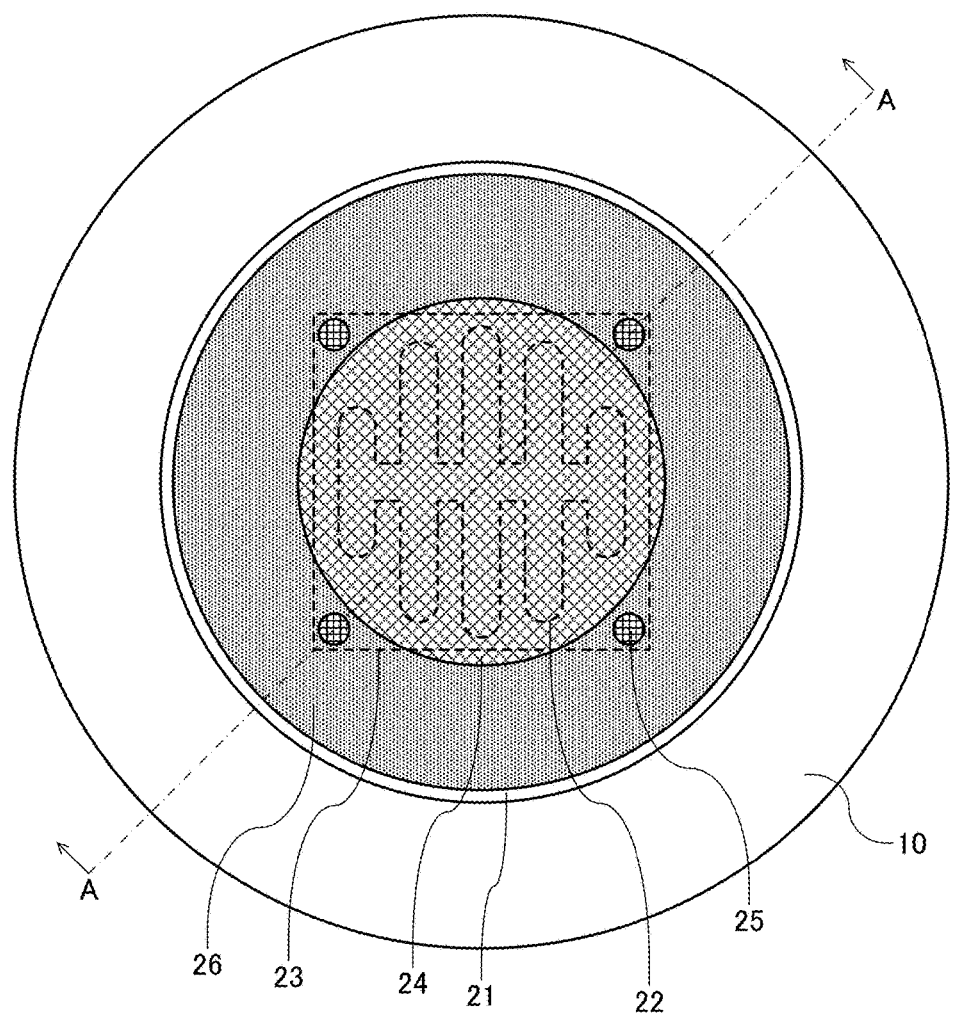
FIG. 1 is a plan view showing an exemplary structure of a nitride semiconductor ultraviolet light-emitting element according to the embodiment of the present invention.
Figure 2:
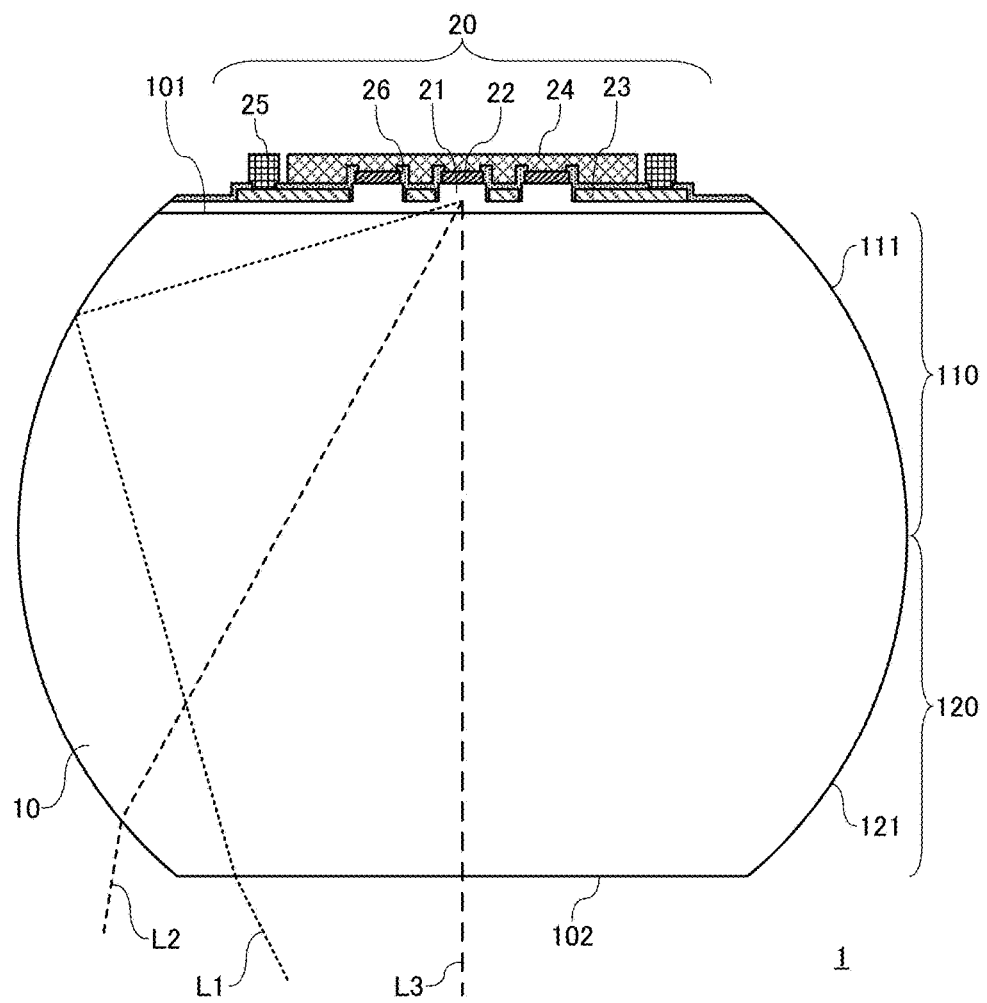
FIG. 2 is a cross-sectional view taken along line A-A in FIG. 1.
Figure 3:
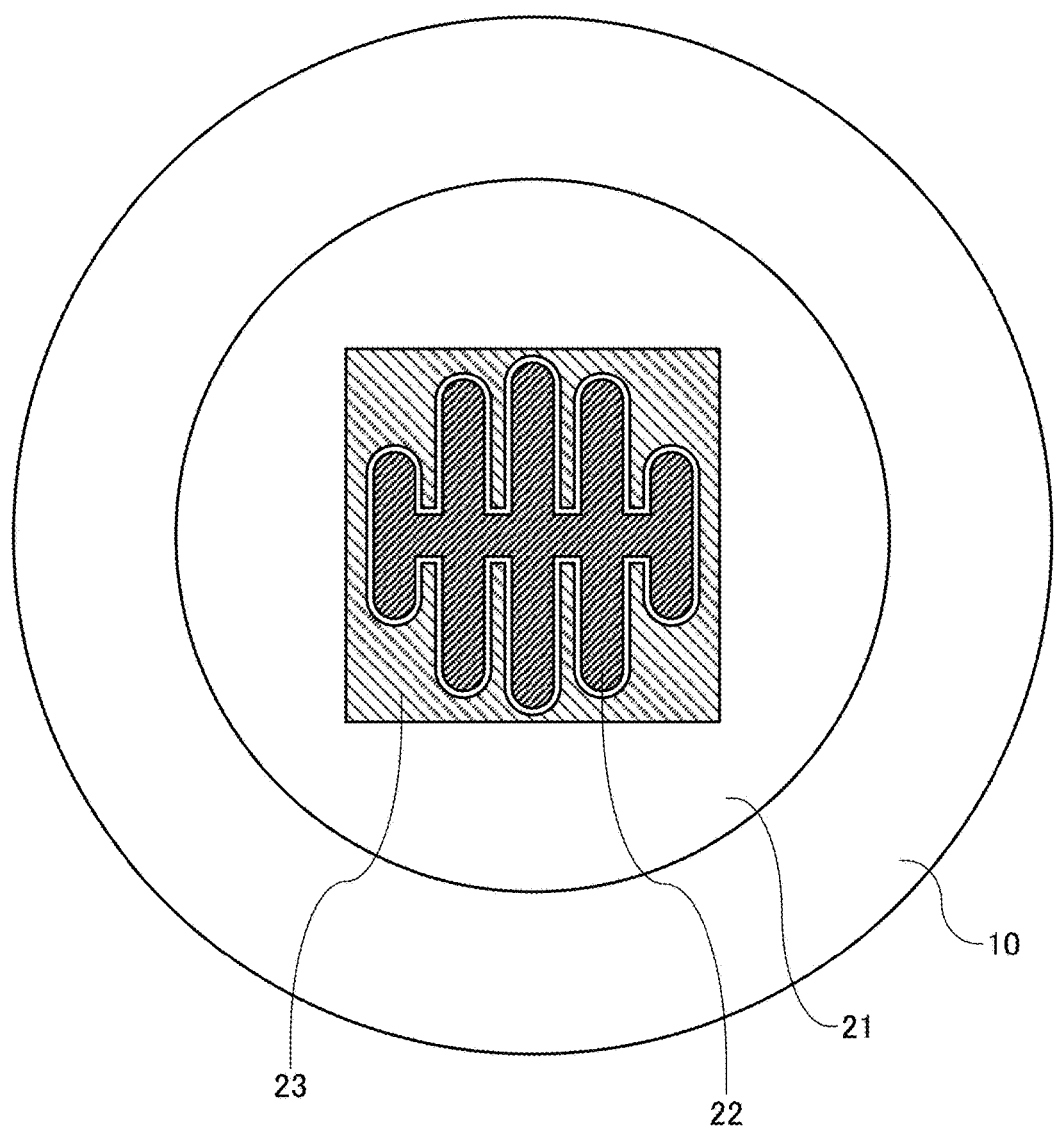
FIG. 3 is a plan view showing a p-electrode and an n-electrode shown in FIG. 1 as being exposed.

Firstly, with reference to the drawings, a description will be given of an exemplary structure of a nitride semiconductor ultraviolet light-emitting element according to an embodiment of the present invention. FIG. 1 is a plan view of the exemplary structure of the nitride semiconductor ultraviolet light-emitting element according to the embodiment of the present invention. FIG. 2 is a cross-sectional view showing a cross section taken along line A-A in FIG. 1. FIG. 3 is a plan view showing a p-electrode and an n-electrode shown in FIG. 1. Note that, while the cross-sectional view of FIG. 2 schematically shows the thickness (the length in the top-bottom direction in the drawing) of each of a substrate, a semiconductor layer, and electrodes for the sake of convenience, the lengths do not necessarily coincide with actual dimensional proportion. In particular, the thickness of the semiconductor layer is shown in an enlarged manner in the drawing as compared to the actual scale.

As shown in FIGS. 1 to 3, a nitride semiconductor ultraviolet light-emitting element 1 according to the embodiment of the present invention includes a substrate 10, and an element structure part 20 formed on a main surface 101 of the substrate 10. The nitride semiconductor ultraviolet light-emitting element 1 is mounted on a mount-purpose base having its element structure part 20 side (the upper side in FIG. 2) opposed to the base (flip-chip mounted), and the light extraction direction is the substrate 10 side (the lower side in FIG. 2). Note that, L1 to L3 in FIG. 2 represent part of light beams of light emitted from the element structure part 20. Further, the element structure part 20 is a portion contributing toward light emission. In other words, the element structure part 20 is a portion through which most of current passes in a conducting state, and light emission fails when this portion is broken.

The substrate 10 is composed of sapphire, and has a shape in which a main surface 101 and a rear surface 102 are flat, and a side circumferential surface 111 connected to the main surface 101 and a side circumferential surface 121 connected to the rear surface 102 are each a convex curved surface. In other words, the substrate 10 is a sphere whose top and bottom are flat cross sections (the main surface 101 and the rear surface 102).

Specifically, the substrate 10 has a first portion 110 extending from the main surface 101 by a first distance, and a second portion 120 extending from the side opposite to the main surface (that is, the rear surface 102) by a second distance. In the first portion 110, the sectional area of a cross section parallel to the main surface 101 continuously increases with distance from the main surface 101. In the second portion 120, the sectional area of a cross section parallel to the main surface 101 continuously increases with distance from the side opposite to the main surface 101. In particular, in the substrate 10, a unit increase amount of the sectional area (that is, the differential value of the sectional area) at a unit distance in the direction distancing from the main surface 101 in the first portion 110 continuously reduces with distance from the main surface 101, and a unit increase amount of the sectional area at a unit distance in the direction distancing from the side opposite to the main surface 101 (that is, the rear surface 102) in the second portion 120 continuously reduces with distance from the side opposite to the main surface 101. Note that, the first distance corresponds to the thickness of the first portion 110, and the second distance corresponds to the thickness of the second portion and, naturally, the sum of them is equal to or less than the thickness of the substrate 10. Further, the substrate 10 is in an exemplary case where the sum of the first distance and the second distance is equal to the thickness of the substrate.

Figure 4:
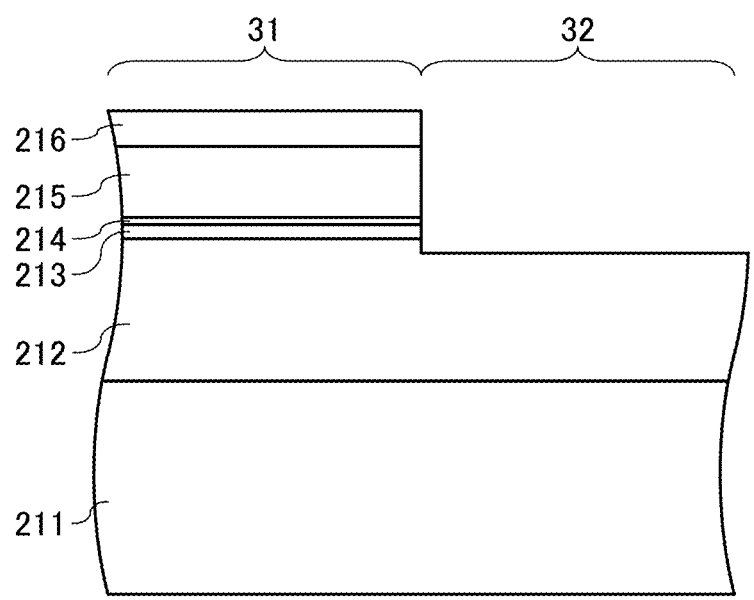
FIG. 4 is a cross-sectional view showing an exemplary structure of an AlGaN-based semiconductor layer.

The element structure part 20 includes an AlGaN-based semiconductor layer 21, a p-electrode 22, an n-electrode 23, a p-type plated electrode 24, an n-type plated electrode 25, and an insulating film 26. Here, with reference to the drawings, a description will be given of an exemplary structure of the AlGaN-based semiconductor layer 21. FIG. 4 is a cross-sectional view showing an exemplary structure of an AlGaN-based semiconductor layer.

As shown in FIG. 4, the AlGaN-based semiconductor layer 21 has a structure in which, sequentially from the substrate 10 side, an underlying layer 211, an n-type cladding layer 212 composed of n-type AlGaN, an active layer 213, an electron block layer 214 composed of p-type AlGaN, a p-type cladding layer 215 composed of p-type AlGaN, and a p-type contact layer 216 composed of p-type GaN are stacked.

The underlying layer 211 is composed of AlN, and is formed on the main surface 101 of the substrate 10. Note that, the underlying layer 211 may have a structure in which AlGaN is stacked on the upper surface of AlN. Further, the active layer 213 has a single- or multi-quantum well structure in which a well layer composed of AlGaN or GaN is interposed between barrier layers composed of n-type AlGaN.

In the AlGaN-based semiconductor layer 21, at a light-emitting region 31, the above-described layers 211 to 216 are formed having the p-type contact layer 216 positioned at the uppermost surface. In a peripheral region 32 surrounding the light-emitting region 31, the active layer 213 and the subsequent layers, that is, layers 213 to 216, are not formed, and the n-type cladding layer 212 is exposed. The p-electrode 22 is formed at the upper surface of the p-type contact layer 216 in the light-emitting region 31. The n-electrode 23 is formed at the upper surface of the n-type cladding layer 212 in the peripheral region 32. When a conducting state is established so that positive holes are supplied from the p-electrode 22 and electrons are supplied from the n-electrode 23, the supplied positive holes and electrons reach the active layer 213 of the light-emitting region 31, and the positive holes and the charges recombine with each other at the active layer 213, whereby light is emitted.

The layers 211 to 216 structuring the AlGaN-based semiconductor layer 21 are formed by any well-known epitaxial growth method such as metal organic vapor phase epitaxy (MOVPE) or molecular beam epitaxy (MBE). For example, Si is added as the donor impurity to n-type layers, and for example, Mg is added as the acceptor impurity to p-type layers. Further, after stacking the layers 211 to 216 on the main surface 101 of the substrate 10, a partial region (the region corresponding to the peripheral region 32) is selectively etched by any well-known etching means such as reactive ion etching, to expose the n-type cladding layer 212 at this region. Thus, the light-emitting region 31 and the peripheral region 32 are formed.

The p-electrode 22 is composed of, for example, Ni/Au, and formed at the upper surface of the p-type contact layer 216 at the light-emitting region 31 as described above. The n-electrode 23 is composed of, for example, Ti/Al/Ti/Au, and formed at the upper surface of the n-type cladding layer 212 at the peripheral region 32 as described above. Further, the n-electrode 23 is formed to surround the light-emitting region 31.

The p-electrode 22 and the n-electrode 23 not only supply the AlGaN-based semiconductor layer 21 with power, but also reflect light generated at the active layer 213 of the light-emitting region 31 toward the substrate 10. In particular, by virtue of the n-electrode 23 formed to surround the light-emitting region 31 reflecting, toward the substrate 10, light which may otherwise leak to the outside from the peripheral region 32 without transmitting through the substrate 10, the amount of light transmitting through the substrate 10 effectively increases.

The p-type plated electrode 24 and the n-type plated electrode 25 are each formed as follows. For example, a Cu body formed by electrolytic plating is covered with at least one metal layer whose outermost surface is Au, the metal layer being formed by electroless plating. Further, the p-type plated electrode 24 and the n-type plated electrode 25 are spaced apart from each other, with their respective upper surfaces planarized and aligned at the same height. Further, part of the p-type plated electrode 24 is in contact with the p-electrode 22, and part of the n-type plated electrode 25 is in contact with the n-electrode 23.

The p-type plated electrode 24 and the n-type plated electrode 25 are provided not only for supplying the AlGaN-based semiconductor layer 21 with power by being connected to the mount-purpose base, but also for dissipating heat generated by the nitride semiconductor light-emitting element 1 by transferring the heat to the mount-purpose base. In particular, since the p-type plated electrode 24 is provided over the whole light-emitting region 31 where current concentrates, effective heat dissipation is achieved.

The insulating film 26 is composed of, for example, $SiO_2$ or $Al_2O_3$, and formed to cover: the upper surface and the side surface of the p-electrode 22 excluding a portion connected to the p-type plated electrode 24; the upper surface and the side surface of the n-electrode 23 excluding a portion connected to the n-type plated electrode 25; the upper surfaces of the light-emitting region 31 and the peripheral region 32 and the side surface of the light-emitting region 31 in the AlGaN-based semiconductor layer 21 where the p-electrode 22 and the n-electrode 23 are not formed and exposed. The insulating film 26 is provided for avoiding contact between the n-electrode 23 and the p-type plated electrode 24 which are formed over a wide area above the main surface 101 of the substrate 10, and for protecting the side surface of the light-emitting region 31 of the AlGaN-based semiconductor layer 21.

As shown in FIG. 2, in the nitride semiconductor ultraviolet light-emitting element 1 according to the embodiment of the present invention, light emitted from the element structure part 20 and becoming incident on the substrate 10 travels inside the substrate 10 to reach the side circumferential surfaces 111, 121 and the rear surface 102. Here, light L1 reaching the side circumferential surface 111 of the first portion 110 is mostly totally reflected due to its great incident angle, and most of the totally reflected light is emitted from the rear surface 102 or the side circumferential surface 121 of the second portion 120 into the air. On the other hand, most of light L2, L3 reaching the rear surface 102 or the side circumferential surface 121 of the second portion 120 are not totally reflected due to their small incident angle, and emitted into the air as they are. In this manner, with the nitride semiconductor ultraviolet light-emitting element 1, a great amount of light can be extracted from the side opposite to the main surface 101 in the light extraction direction.

Further, in contrast to the light-emitting element proposed by Patent Document 1 which employs a glass material greater in refractive index than sapphire as a lens, the nitride semiconductor ultraviolet light-emitting element 1 uses the sapphire substrate 10 as a lens. Thus, the present embodiment is capable of minimizing the interface reflection in extracting light into the air. Hence, the light extraction efficiency effectively improves.

Further, the nitride semiconductor ultraviolet light-emitting element 1 according to the embodiment of the present invention can be manufactured by the simple technique of processing the substrate 10, without the necessity of employing the high-level technique of bonding the substrate and the lens to each other as in Non-Patent Document 1. Note that, the method of processing the substrate 10 will be described in <Exemplary Method for Manufacturing Nitride Semiconductor Ultraviolet Light-Emitting Element> which will follow.

Note that, while FIGS. 1 and 3 show the exemplary case where the outer contour of the n-electrode 23 is square-shaped, the shape and size of the n-electrode 23 may be arbitrarily determined. For example, the n-electrode 23 may be circular-shaped. Alternatively, the n-electrode 23 may be provided over the entire peripheral region 32 (the n-electrode 23 may reach the end of the substrate 10, or may extend just short of the end). Further, FIG. 1 shows the exemplary case where the p-type plated electrode 24 is circular-shaped and the diameter of the p-type plated electrode 24 is greater than the diameter of an inscribed circle for the outer contour (square contour) of the n-electrode 23, the shape or size of the p-type plated electrode 24 may be arbitrarily determined.

Further, while FIG. 2 show the exemplary case where the side circumferential surface 111 of the first portion 110 and the side circumferential surface 121 of the second portion 120 of the substrate 10 are each a convex curved surface, they may each be a concave curved surface instead of convex, or a flat surface instead of a curved surface. As compared to a substrate whose side surface is a flat surface perpendicular to its main surface, the substrate 10 being in any of the foregoing shapes is capable of increasing the incident angle of light emitted from the element structure part 20 and reaching the side circumferential surface 111 of the first portion 110 of the substrate 10 and capable of reducing the incident angle of light emitted from the element structure part 20 and reaching the side circumferential surface 121 of the second portion 120 of the substrate 10. Hence, a greater amount of light can be extracted from the side opposite to the main surface 101. Note that, when the side circumferential surfaces 111, 121 of the first portion 110 and the second portion 120 of the substrate 10 are each a convex curved surface, the incident angle of light emitted from the element structure part 20 and reaching the side circumferential surface 111 of the first portion 110 of the substrate 10 further increases, and the incident angle of light emitted from the element structure part 20 and reaching the side circumferential surface 121 of the second portion 120 of the substrate 10 further reduces. Hence, a greater amount of light can be extracted from the side opposite to the main surface 101.

<Exemplary Method for Manufacturing Nitride Semiconductor Ultraviolet Light-Emitting Element>

In general, the chip-like nitride semiconductor ultraviolet light-emitting element 1 as shown in FIGS. 1 and 2 is obtained by singulating a wafer, in which a plurality of element structure parts are arrayed on the main surface of a flat-plate-like substrate, into the individual element structure parts. However, since the substrate 10 included in the chip-like nitride semiconductor ultraviolet light-emitting element 1 shown in FIG. 2 has a shape in which the side circumferential surface 111 of the first portion 110 and the side circumferential surface 121 of the second portion 120 are each a convex curved surface, a process of forming the substrate 10 into such a shape is necessary. Accordingly, in the following, with reference to the drawings, a description will be given of a method for manufacturing the nitride semiconductor ultraviolet light-emitting element 1 according to the embodiment of the present invention focusing on a step of processing the side circumferential surface 111 of the first portion 110 and the side circumferential surface 121 of the second portion 120 of the substrate 10 to each be a convex curved surface.

Figure 5:
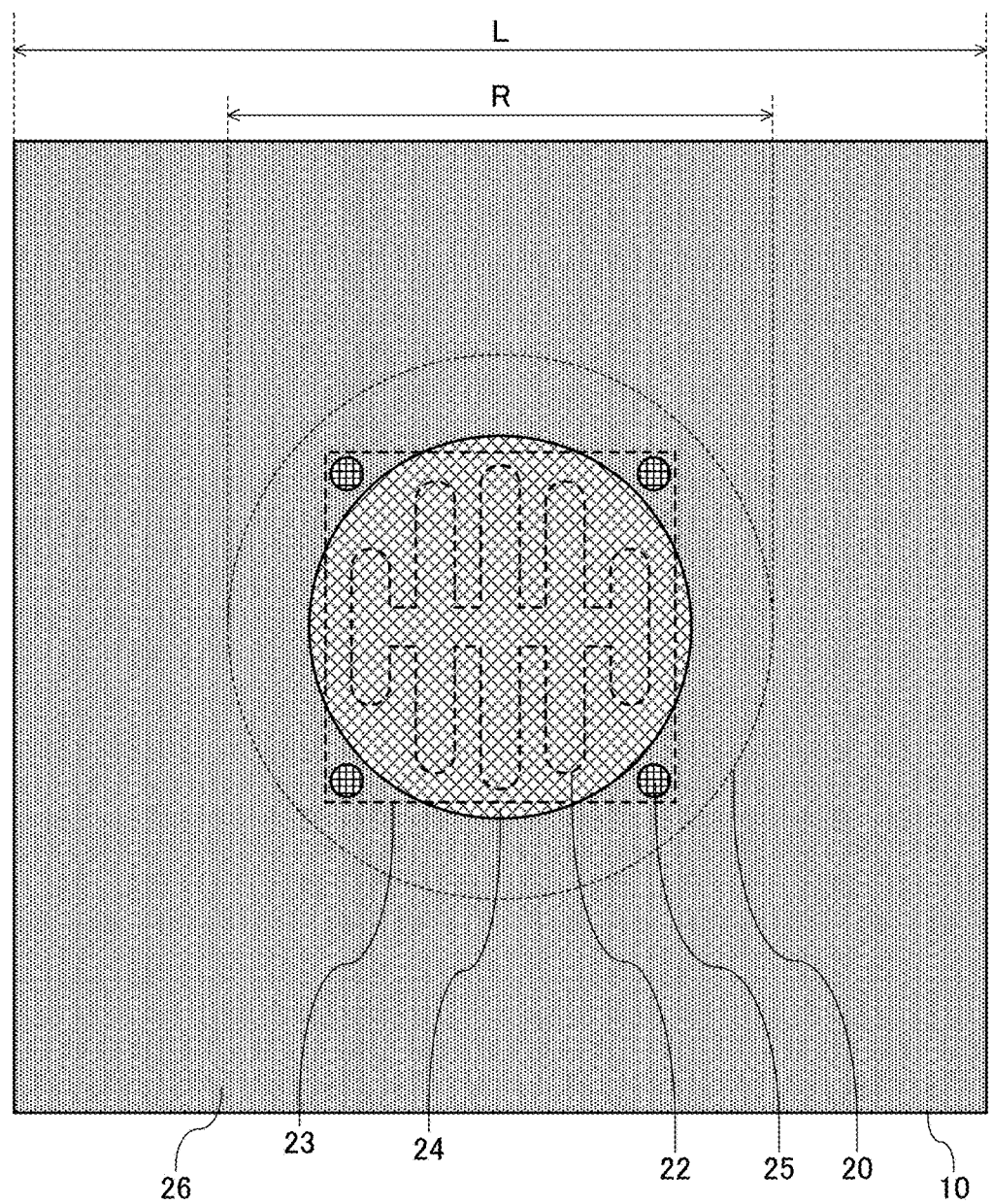
FIG. 5 is a plan view showing an exemplary structure of a chip obtained by singulating a wafer.
Figure 6:
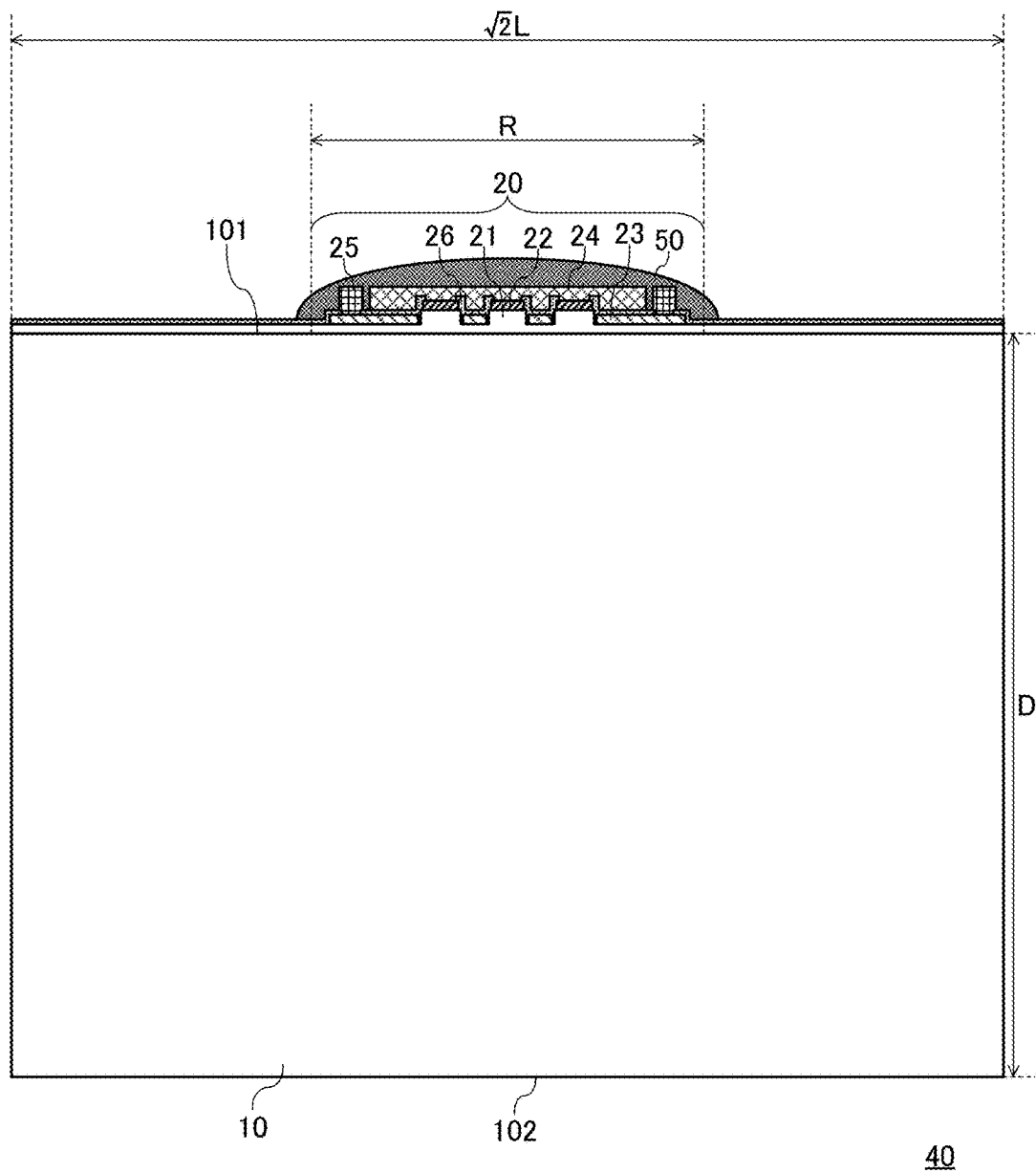
FIG. 6 is a cross-sectional view showing an exemplary structure of a chip before a substrate is processed.

FIG. 5 is a plan view showing an exemplary structure of a chip obtained by singulating a wafer, showing a plane similarly to that shown in FIG. 1. FIG. 6 is a cross-sectional view showing an exemplary structure of the chip before the substrate is processed, showing a cross section similarly to that shown in FIG. 2. As shown in FIG. 6, in the method for manufacturing the nitride semiconductor ultraviolet light-emitting element 1 according to the embodiment of the present invention, a protective member 50 covering the surface of the element structure part 20 on the substrate 10 is provided. Note that, while FIG. 6 shows an exemplary case where the protective member 50 covers the surface of the element structure part 20 and its surroundings, the protective member 50 may cover a wider range (for example, the entire surface on the main surface 101 side of the substrate 10). Then, as will be described in the following, by subjecting the chip 40 to a grinding process and thereafter removing the protective member 50, the nitride semiconductor ultraviolet light-emitting element 1 including the substrate 10 having the shape as shown in FIG. 2 is obtained.

As the protective member 50, for example, glue or a resin material (for example, epoxy, acrylic) can be employed. Glue can be removed by being dissolved in a water-based solvent (pure water, hot water or the like), and a resin material can be removed by being dissolved in an organic solvent such as trichloroethylene or acetone.

Figure 7:
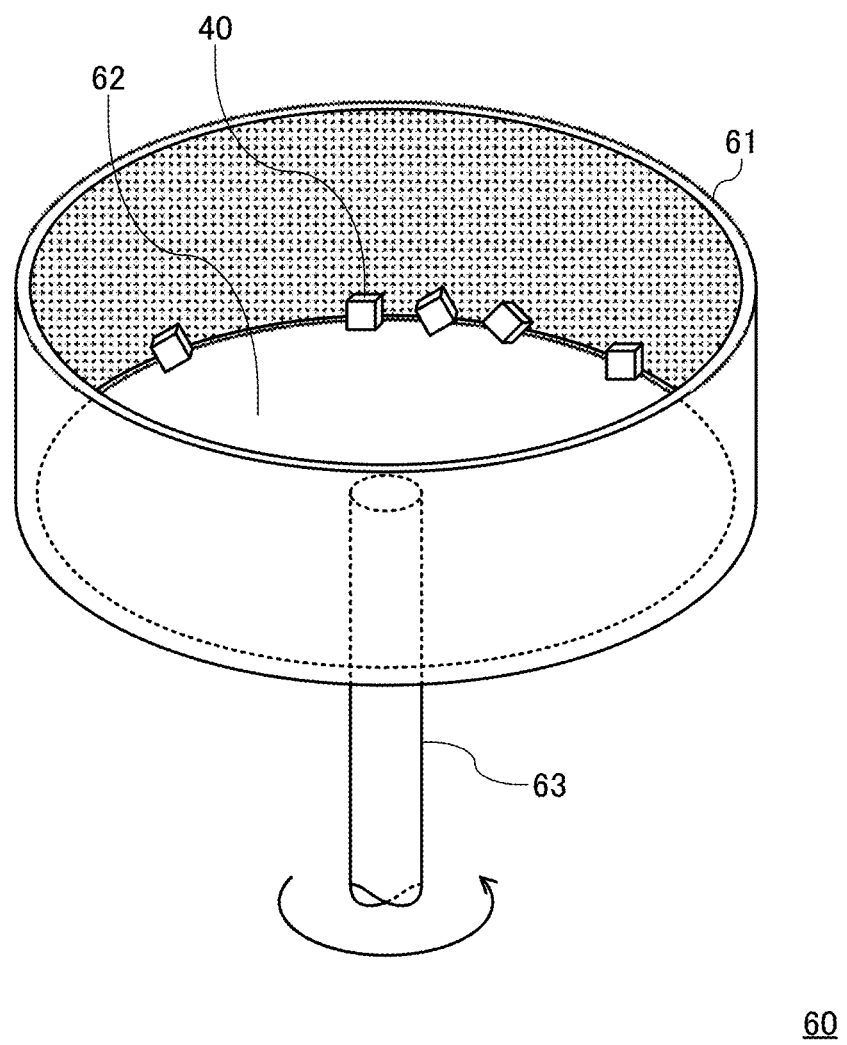
FIG. 7 is a perspective view showing an exemplary grind-processing apparatus with which the chip shown in FIG. 6 is subjected to a grinding process.

FIG. 7 is a perspective view showing an exemplary grind-processing apparatus with which the chip shown in FIG. 6 is subjected to a grinding process. As shown in FIG. 7, the grind-processing apparatus 60 includes a cylindrical side wall part 61 having an inner side to which abrasive grains composed of diamond or the like are attached, a circular bottom part 62 inscribed in the side wall part 61, and a rotation shaft 63 rotating the bottom part 62. Note that, as the grind-processing apparatus 60, for example, a grind-processing apparatus such as proposed by Japanese Patent Application Publication NO. 2008-168358 or Japanese Patent Application Publication NO. 2006-35334 may be employed.

The above-described chip 40 is placed in the space surrounded by the side wall part 61 and the bottom part 62 of the grind-processing apparatus 60. A lid part (not shown) for closing the space to prevent the chip 40 from flying out is set on the opening end (the upper side in the drawing) of the side wall part 61, and the bottom part 62 is rotated. Then, the chip 40 collides with the side wall part 61 and is ground while rolling. Here, since the inner side of the side wall part 61 is a concave curved surface, the corners of the chip 40 collide with the side wall part 61 and are ground. Further, since the chip 40 rolls, the chip 40 is ground isotropically.

When the chip 40 is ground isotropically in the above-described manner, the side surface of the substrate 10 is ground to be a spherical surface. Note that, when the thickness of the substrate 10 is excessively great, not the side surface of the substrate 10 but the main surface 101 is preferentially ground, whereby the element structure part 20 is ground. Accordingly, the thickness of the substrate 10 is preferably equal to or less than the upper limit value shown in the right side in the following Expression (1).

In the following Expression (1), D is the thickness of the substrate, L is the length of one side of the main surface 101 of the substrate 10 being square, and R is the diameter of the circumcircle of the element structure part 20, all of which are values before the grinding process (see FIGS. 5 and 6). Further, the conditions for the following Expression (1) are the conditions for realizing the state where, at the time point where the side surface of the substrate 10 is ground to become a spherical surface (that is, at the time point where the radius of the sphere becomes L/2), a not-ground region having a radius of R/2 or greater is left on the main surface 101 (that is, the element structure part 20 is not ground). Note that, in the chip 40 exemplarily shown in FIGS. 5 and 6, the circumcircle having the diameter R of the element structure part 20 is large enough to enclose the electrodes 23 to 26, and larger than the circumcircle of the outermost electrode 25 (for example, a margin is secured by at least the thickness of the electrode 25).

[Mathematical Expression 1]

$$D \le 2 \times \sqrt{\left(\frac{L}{2}\right)^2 - \left(\frac{R}{2}\right)^2} \quad (1)$$

On the other hand, when the thickness of the substrate 10 is excessively small, while the side surface of the substrate 10 can be processed to become a spherical surface, light emitted from the element structure part 20 may not fully reach the side surface of the substrate 10, and the effect of the substrate 10 having been subjected to the grinding process may not be fully exhibited. Accordingly, preferably, the thickness of the substrate 10 is great enough for light emitted from the element structure part 20 to reach the side surface of the substrate 10. For example, as disclosed in WO 2015/111134 which is an international application filed by the present applicant, setting the thickness of the substrate 10 to 0.45×L or greater, light emitted from the element structure part 20 fully reaches the side surface of the substrate 10 and hence is preferable.

Figure 8A:
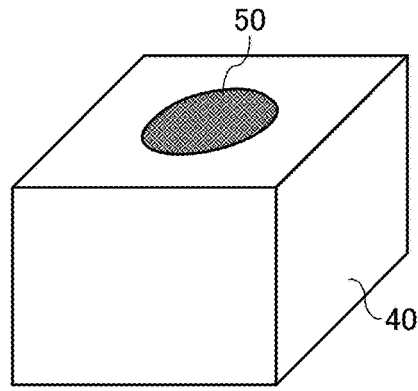
FIGS. 8A to 8F are perspective views showing the course of the chip shown in FIG. 6 being subjected to the grinding process with the grind-processing apparatus shown in FIG. 7.
Figure 8B:
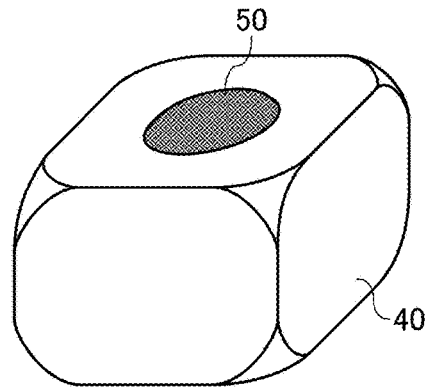
Figure 8C:
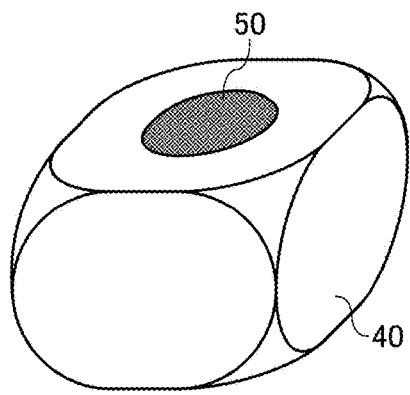
Figure 8D:
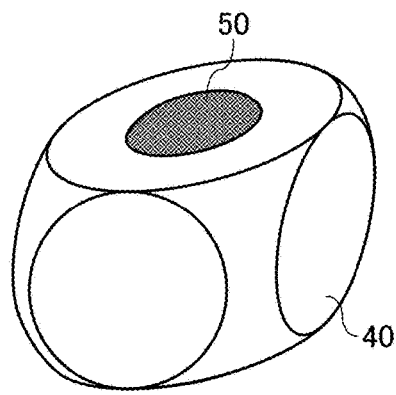
Figure 8E:
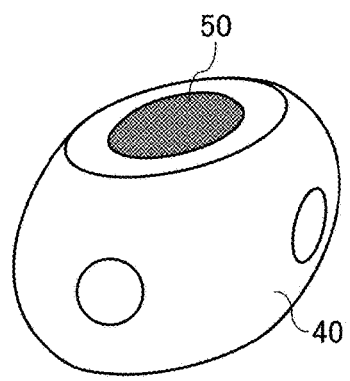
Figure 8F:
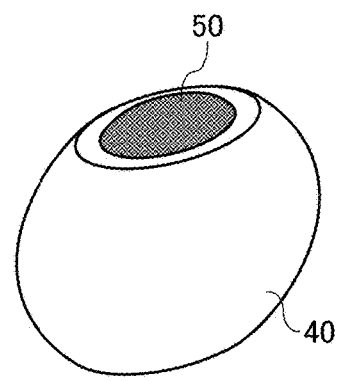

FIGS. 8A to 8F are perspective views showing the course of the chip shown in FIG. 6 being subjected to the grinding process with the grind-processing apparatus shown in FIG. 7, showing the progress of the grinding process in order of 8A, 8B, 8C, 8D, 8E, and 8F. As shown in FIGS. 8A to 8F, through the grinding process with the grind-processing apparatus 60, the chip 40 has its corners ground isotropically. Specifically, from the four corners at each of the main surface 101 and the rear surface 102 of the substrate 10 (see FIG. 6), corners are successively ground. Ultimately, as shown in FIG. 8F, all the corners are ground and leave a spherical surface.

Then, allowing the protective member 50 of the chip 40 having undergone the grinding process to dissolve in a solvent, the nitride semiconductor ultraviolet light-emitting element 1 as shown in FIG. 2 is obtained. In this manner, when the protective member 50 is removed by being dissolved in a solvent, the protective member 50 can be removed without the necessity of applying excessive stress to the element structure part 20. That is, the element structure part 20 is prevented from being broken.

Subjecting the substrate 10 to the grinding process according to the above-described grinding process method, a plurality of chips 40 can undergo the grinding process at once while their respective element structure parts 20 are prevented from being broken. That is, volume production of the nitride semiconductor ultraviolet light-emitting element 1 is achieved.

Note that, the grind-processing apparatus 60 shown in FIG. 7 is merely an example, and the chip 40 may be subjected to the grinding process with another grind-processing apparatus. For example, the grind-processing apparatus 60 shown in FIG. 7 is for causing the chip 40 to roll by the bottom part 62 being a portion of the container rotating about the vertical direction. Here, it is also possible to employ a grind-processing apparatus in which at least a portion of its container rotates about the direction having a horizontal direction component so as to cause the chip 40 to roll. However, use of a grind-processing apparatus capable of causing the chip 40 to roll in a container having a concave curved surface to which abrasive grains are attached thereby causing the chip 40 to collide with the curved surface is preferable, because it exhibits an effect similar to that exhibited by the grind-processing apparatus 60.

Further, the side surface of the substrate 10 may be subjected to the grinding process to become a spherical surface using an NC (Numerical Control) lathe or the like. However, through such a grinding process method, it is difficult to subject a plurality of chips 40 to the grinding process at once, in contrast to the case where the grind-processing apparatus 60 shown in FIG. 7 is used.

<Variations and Others>

[1] In the case where the side surface of the substrate 10 is processed to become a spherical surface using the grind-processing apparatus 60 as shown in FIG. 7, the grinding process leaves minor recesses and projections at the side circumferential surface 121 of the second portion 120 of the substrate 10. Such minor recesses and projections tend to reflect light reaching the side circumferential surface 121, whereby the light extraction efficiency may reduce. Accordingly, in order to prevent such a reduction in the light extraction efficiency, as to the chip 40 having undergone the grinding process, the side circumferential surface 121 of the second portion 120 of the substrate 10 may undergo a polishing work. For example, the surface of the chip 40 having undergone the grinding process may be polished using a well-known sphere polishing apparatus such as a barrel polishing machine.

Figure 9:
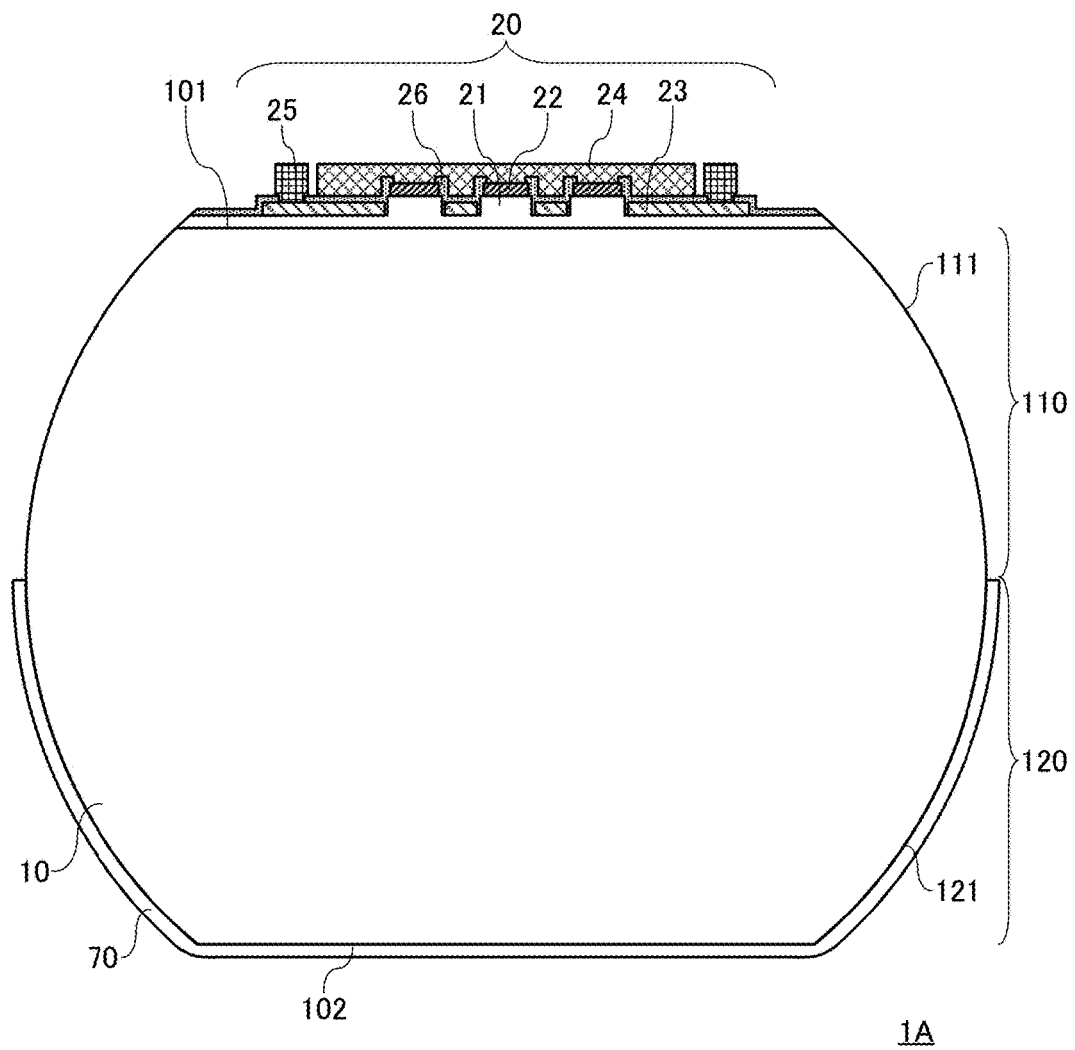
FIG. 9 is a cross-sectional view showing a structure of a first variation of the nitride semiconductor ultraviolet light-emitting element according to the embodiment of the present invention.

Further, in order to prevent a reduction in the light extraction efficiency, reflection of light reaching the side circumferential surface 121 of the second portion 120 of the substrate 10 may be minimized by, instead of subjecting the chip 40 to a polishing work, burying the recessed portions of the side circumferential surface 121 with any film. With reference to the drawings, a description will be given of the structure of the nitride semiconductor ultraviolet light-emitting element in this case. FIG. 9 is a cross-sectional view showing the structure of a first variation of the nitride semiconductor ultraviolet light-emitting element according to the embodiment of the present invention, showing the cross section corresponding to FIG. 2.

As shown in FIG. 9, at the side circumferential surface 121 of the second portion 120 and the rear surface 102 of the substrate 10 of a nitride semiconductor ultraviolet light-emitting element 1A, a transmissive member 70 is formed. Preferably, the transmissive member 70 is composed of a material that transmits light emitted from the element structure part 20 and barely deteriorates due to the light (being resistant to the light). Further, in view of minimizing reflection of light at the side circumferential surface 121 of the second portion 120 and the rear surface 102 of the substrate 10, the transmissive member 70 is preferably composed of a material being smaller in refractive index than sapphire of which the substrate 10 is composed, and greater in refractive index than the air. Specifically, for example, the transmissive member 70 is preferably composed of amorphous fluororesin.

Further, without being specified to the side circumferential surface 121 of the second portion 120 and the rear surface 102 of the substrate 10, any other portion may be covered with the transmissive member 70. For example, a single or a plurality of nitride semiconductor ultraviolet light-emitting element(s) mounted on the base may be entirely sealed (embedded) with the transmissive member 70. In this case, by covering a surface of at least one of the p-type plated electrode 24 and the n-type plated electrode 25 (the surface of a portion not being brought into contact with an electrode of the mount-purpose base, and the side surface excluding the upper surface in FIG. 9) with the transmissive member 70, short-circuiting can be prevented. In particular, the transmissive member 70 is preferably composed of non-bondable amorphous fluororesin, which is capable of suitably preventing migration of metal atoms.

Non-bondable amorphous fluororesin is disadvantageous in its weak bonding force to metal or sapphire of which the substrate 10 is composed. However, after the nitride semiconductor ultraviolet light-emitting element 1A is mounted on a base, by causing the transmissive member 70 to enter the clearance between the nitride semiconductor ultraviolet light-emitting element 1A and the base so as to cover the surface of at least one of the p-type plated electrode 24 and the n-type plated electrode 25, the transmissive member 70 becomes less prone to be removed. Further, when a multitude of recesses and projections are formed at the side circumferential surface 111 of the first portion 110 and the side circumferential surface 121 of the second portion 120 of the substrate 10, the bonding force between the side circumferential surfaces 111, 121 and the transmissive member 70 increases by virtue of the anchoring effect. Thus, the transmissive member 70 becomes less prone to be removed.

The amorphous fluororesin may be, for example, fluororesin crystalline polymers being copolymerized so as to be amorphous as polymer alloy, or a copolymer of perfluoro dioxole (product name Teflon AF (registered trademark) available from DuPont) or cyclized polymer of perfluoro butenyl vinyl ether (product name CYTOP (registered trademark) available from Asahi Glass Co., Ltd). Further, the non-bondable amorphous fluororesin may be amorphous fluororesin in which a structural unit structuring a polymer or a copolymer has a fluorine-containing aliphatic cyclic structure, and the terminal functional group is a perfluoroalkyl group such as $CF_3$. The perfluoroalkyl group does not have a reactive terminal functional group being bondable to metal or the like. Note that, bondable amorphous fluororesin is different from non-bondable amorphous fluororesin in having a reactive functional group being bondable to metal or the like as the terminal functional group, though they have a structural unit structuring a polymer or a copolymer of the same fluorine-containing aliphatic cyclic structure. The reactive functional group is, as an example, a carboxyl group (COOH) or an ester group (COOR). Note that, R represents an alkyl group.

Further, the structural unit having the fluorine-containing aliphatic cyclic structure is preferably a unit based on a cyclic fluorine-containing monomer (hereinafter referred to as "unit A"), or a unit formed by cyclopolymerization of diene fluorine-containing monomers (hereinafter referred to as "unit B"). Note that, the composition and structure of amorphous fluororesin are not the subject of the present invention and therefore a detailed description as to unit A and unit B is omitted. Reference should be made to paragraphs [0031] to [0062] of WO 2014/178288 where a detailed description of unit A and unit B is given.

Exemplary commercially available non-bondable amorphous fluororesin is CYTOP (available from Asahi Glass Co., Ltd). Note that, CYTOP whose terminal functional group is $CF_3$ is a polymer of unit B represented by the following Chemical Formula 1:

[Chemical Formula 1]

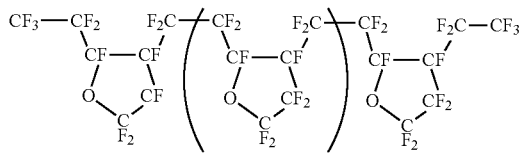

Note that, as described above, in the case where not only the side circumferential surface 121 of the second portion 120 and the rear surface 102 of the substrate 10 but also at least one of the p-type plated electrode 24 and the n-type plated electrode 25 is covered with the transmissive member 70, the transmissive member 70 may be composed of different materials respectively for covering those portions. For example, the transmissive member 70 covering at least one of the p-type plated electrode 24 and the n-type plated electrode 25 may be composed of non-bondable amorphous fluororesin in view of minimizing migration of metal atoms, and the transmissive member 70 covering the side circumferential surface 121 of the second portion 120 and the rear surface 102 of the substrate 10 may be amorphous fluororesin not being non-bondable.

Further, the transmissive member 70 is capable of minimizing reflection of light at the interface with the air when the outermost surface is composed of amorphous fluororesin. Accordingly, between the amorphous fluororesin and the substrate 10 (in particular, the side circumferential surface 121 of the second portion 120), a layer composed of other material transmitting light emitted from the element structure part 20 may be provided. For example, the transmissive member 70 may have a layer composed of an inorganic material such as $SiO_2$ or $HfO_2$ between the amorphous fluororesin and the substrate 10, and a plurality of such layers may be provided. Specifically, for example, the transmissive member 70 may have a layer composed of $HfO_2$ formed on the surface of the substrate 10, and a layer composed of $SiO_2$ formed further on the surface of the $HfO_2$ layer.

In particular, the transmissive member 70 may include a single-layer-structure or multilayer-structure antireflection layer between the amorphous fluororesin and the substrate 10. The thickness of one antireflection layer is $\lambda/4n$, where n is the refractive index of the antireflection layer and $\lambda$ is the wavelength of light emitted from the element structure part 20. For example, one antireflection layer is composed of $SiO_2$ or $HfO_2$. Provision of such an antireflection layer further improves the light extraction efficiency. Note that, in order to achieve the antireflection effect exhibited by the antireflection layer, it is important to form the antireflection layer by a designed thickness. Here, on the rear surface 102 which is a flat surface parallel to the main surface 101, the antireflection layer can be easily provided by the designed thickness. Accordingly, preferably, the antireflection layer is formed at least on the rear surface 102 of the substrate 10. Further, as in the above-described case where the $SiO_2$ layer or the $HfO_2$ layer is formed between the amorphous fluororesin and the substrate 10, firstly, the $SiO_2$ layer or the $HfO_2$ layer should be formed on the substrate 10 by any well-known growth method such as sputtering, and thereafter the amorphous fluororesin layer should be formed and the amorphous fluororesin should be provided for sealing. Further, in the case where the antireflection layer is formed on the rear surface 102 of the substrate 10, taking into consideration that light emitted from the element structure part 20 spreads to some extent (that is, the incident angle of light reaching the rear surface 102 increases to some extent), the antireflection layer may be formed by a thickness with which the light of such an incident angle can be reflected. Specifically, it is also possible to form the antireflection layer having its thickness designed not for the light emitted from the element structure part 20 and becoming perpendicularly incident on the rear surface 102 (that is, the light whose incident angle is 0°), but for the light becoming incident on the rear surface 102 by a predetermined incident angle, for example, an angle greater than 0° and smaller than the critical angle. Note that, when the refractive index of sapphire is 1.8 and the refractive index of the amorphous fluororesin is 1.35, the critical angle is 48.6°. Forming such an antireflection layer makes it possible to effectively extract light whose incident angle is smaller than the critical angle, and eliminate excessive grinding of the rear surface 102.

Further, while FIG. 9 exemplarily shows the nitride semiconductor ultraviolet light-emitting element 1A in which the transmissive member 70 is also provided at the rear surface 102 of the substrate 10, the transmissive member 70 may not be provided at the rear surface 102. Further, in the case where the recesses and projections attributed to the grinding process do not exist at the side circumferential surface 121 of the second portion 120 of the substrate 10 also, provision of the transmissive member 70 to side circumferential surface 121, in which transmissive member 70 amorphous fluororesin smaller in refractive index than sapphire and greater than the air is formed at the outermost surface, minimizes reflection of light at the interface with the air.

[2] In the case where the side surface of the substrate 10 is subjected to the grinding process with the grind-processing apparatus 60 as shown in FIG. 7, minor recesses and projections are formed at the side circumferential surface 111 of the first portion 110 of the substrate 10. Such minor recesses and projections may hinder reflection of light, resulting in a reduction in the light extraction efficiency. Addressing such a problem, the chip 40 having undergone the grinding process may be subjected to a polishing work on the side circumferential surface 111 of the first portion 110 of the substrate 10. For example, the surface of the chip 40 having undergone the grinding process may be polished with a well-known sphere polishing apparatus such as a barrel polishing machine.

Figure 10:
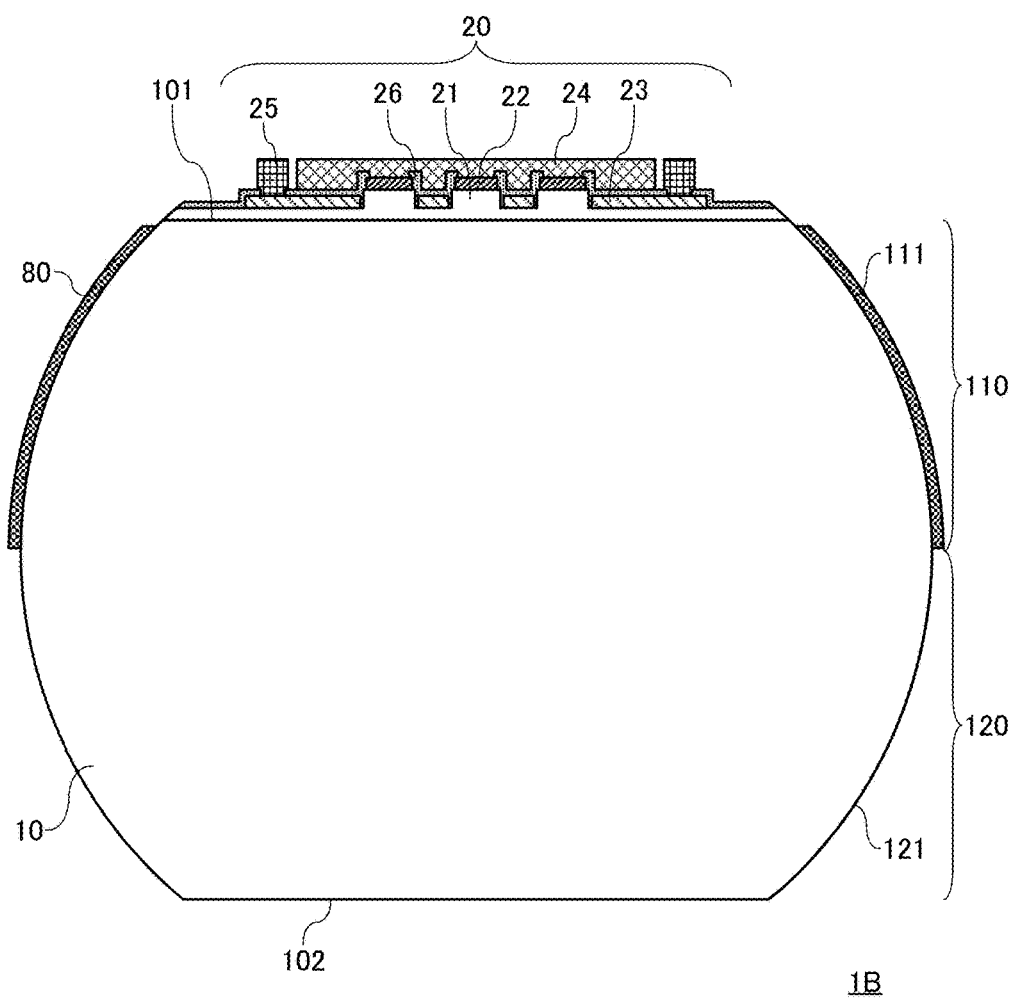
FIG. 10 is a cross-sectional view showing a structure of a second variation of the nitride semiconductor ultraviolet light-emitting element according to the embodiment of the present invention.

Further, in order to prevent a reduction in the light extraction efficiency, scattering of light emitted from the element structure part 20 may be minimized by, instead of subjecting the chip 40 to a polishing work, burying the recesses and projections at the surface of the side circumferential surface 111 at the first portion 110 of the substrate 10 with any film. With reference to the drawings, a description will be given of the structure of the nitride semiconductor ultraviolet light-emitting element in this case. FIG. 10 is a cross-sectional view of the structure of a second variation of the nitride semiconductor ultraviolet light-emitting element according to the embodiment of the present invention, showing the cross section corresponding to FIG. 2.

As shown in FIG. 10, at the side circumferential surface 111 of the first portion 110 of the substrate 10 of a nitride semiconductor ultraviolet light-emitting element 1B, a reflective member 80 is formed. The reflective member 80 is composed of a material that reflects light emitted from the element structure part 20, for example, preferably a material containing at least one of Al, Ni, and Rh.

Further, in the case where the recesses and projections attributed to the grinding process do not exist at the side circumferential surface 111 of the first portion 110 of the substrate 10 also, provision of the reflective member 80 at the side circumferential surface 111 of the first portion 110 facilitates reflection at the side circumferential surface 111 of the first portion 110.

Figure 11:
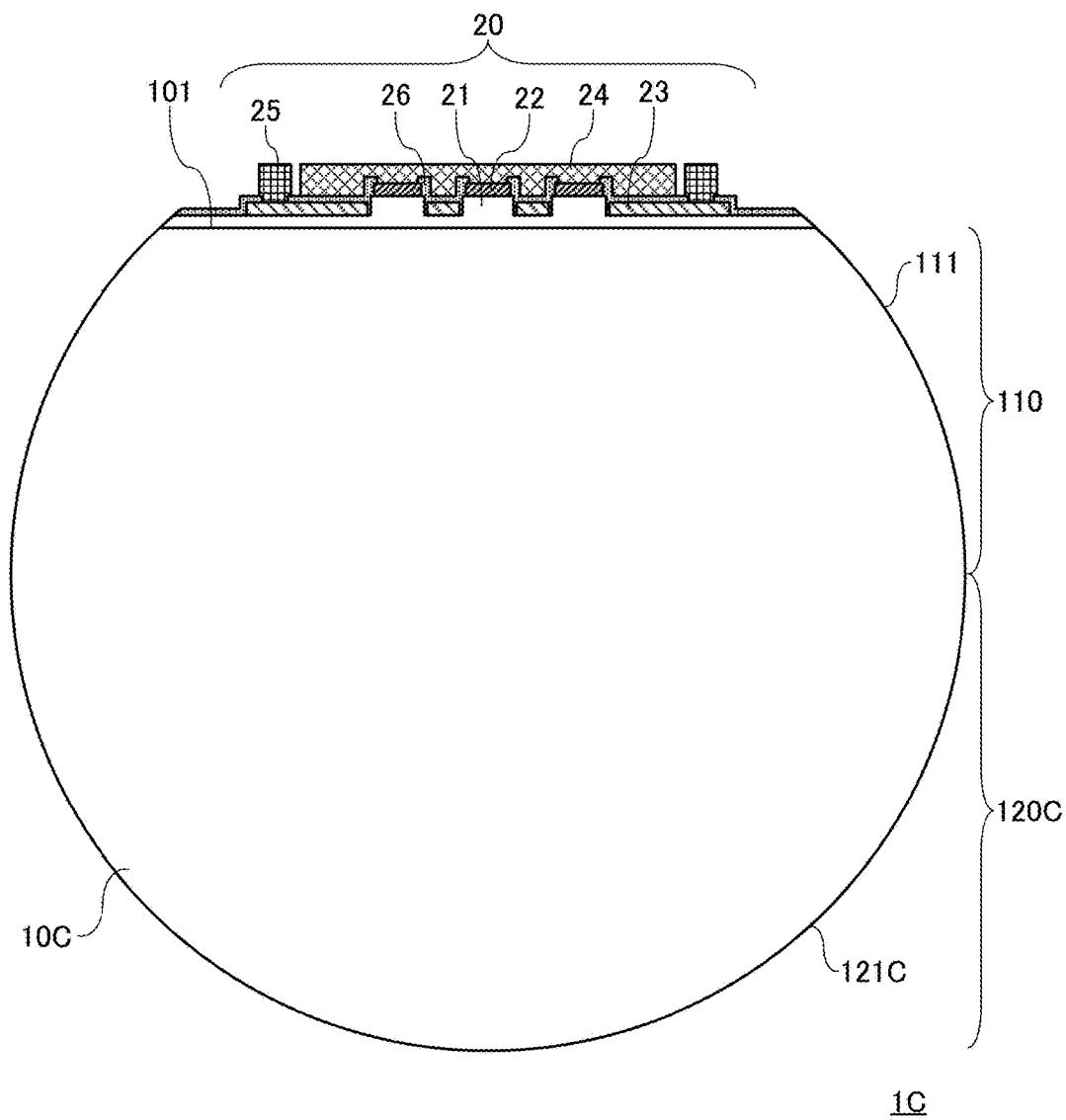
FIG. 11 is a cross-sectional view showing a structure of a third variation of the nitride semiconductor ultraviolet light-emitting element according to the embodiment of the present invention.

[3] In the above-described embodiment, the nitride semiconductor ultraviolet light-emitting element 1 in which the main surface 101 and the rear surface 102 of the substrate 10 are flat is exemplarily shown (see FIG. 2). However, the flat rear surface 102 may not be provided, and the side opposite to the main surface 101 may be a curved surface. With reference to the drawings, a description will be given of the structure of the nitride semiconductor ultraviolet light-emitting element in this case. FIG. 11 is a cross-sectional view of the structure of a third variation of the nitride semiconductor ultraviolet light-emitting element according to the embodiment of the present invention, showing a cross section corresponding to FIG. 2.

As shown in FIG. 11, in a substrate 10C of a nitride semiconductor ultraviolet light-emitting element 1C, a side circumferential surface 121C of a second portion 120C is hemispherical. Note that, the nitride semiconductor ultraviolet light-emitting element 1C having the substrate 10C of such a shape can be obtained by, for example, subjecting the chip 40 (see FIG. 6) to a grinding process with an NC lathe.

As the nitride semiconductor ultraviolet light-emitting element 1C shown in FIG. 11, when the side circumferential surface 121C of the second portion 120C is hemispherical, the incident angle of light emitted from the element structure part 20 and reaching the side circumferential surface 121C of the second portion 120C becomes extremely small. However, in order to process the substrate 10C to have such a shape, the entire rear surface must be subjected to grinding process while leaving the main surface 101 where the element structure part 20 is formed. This is difficult to realize by an isotropic grinding process and, therefore, is not suitable for volume production. Further, as the nitride semiconductor ultraviolet light-emitting element 1 according to the above-described embodiment (see FIG. 2), provided that the flat rear surface 102 is left at the substrate 10, the incident angle of light emitted from the element structure part 20 and reaching the rear surface 102 becomes small enough. Accordingly, in the case where the flat rear surface 102 is left also, a reduction in the light extraction efficiency due to the flat rear surface 102 is small. Further, when the flat rear surface 102 is left, handleability improves, e.g., the chip can be picked up by the rear surface 102 under vacuum.

[4] In view of preventing concentration of light in one particular direction in the substrate 10, the substrate 10 and the light-emitting region 31 preferably have respective rotationally symmetric shapes of 2-fold rotational symmetry or greater in a plan view as seen in the direction perpendicular to the main surface 101 of the substrate 10 (hereinafter simply referred to as seen in a plan view), each center of which coincides. Further, in view of efficient power supply to the active layer 213, the light-emitting region 31 has a shape radially projecting in a plurality of directions from the center of rotational symmetry as seen in a plan view.

Figure 12:
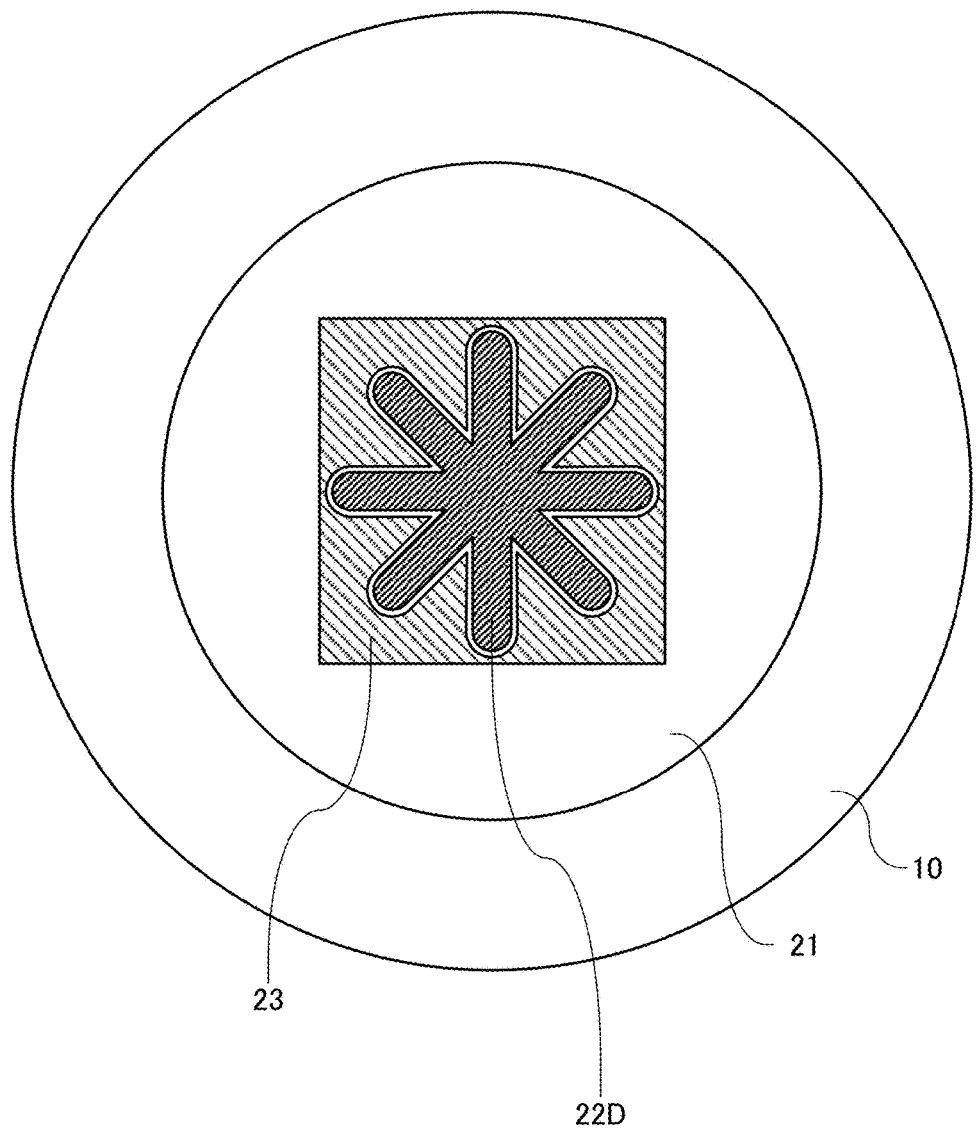
FIG. 12 is a plan view showing a structure of a fourth variation of the nitride semiconductor ultraviolet light-emitting element according to the present invention.

The main surface 101 and the light-emitting region 31 (the region where the p-electrode 22 is formed) of the substrate 10 of the nitride semiconductor ultraviolet light-emitting element 1 shown in FIGS. 1 to 4 each have a shape satisfying the above-described condition. While the light-emitting region 31 has 2-fold symmetry, a light-emitting region having higher-order rotational symmetry may be provided. With reference to the drawings, a description will be given of the structure of the nitride semiconductor ultraviolet light-emitting element in this case. FIG. 12 is a plan view of the structure of a fourth variation of the nitride semiconductor ultraviolet light-emitting element according to the embodiment of the present invention, showing a plane corresponding to FIG. 3.

The light-emitting region (the region where the p-electrode 22D is formed) of the nitride semiconductor ultraviolet light-emitting element shown in FIG. 12 is chrysanthemum-shaped, radially projecting in eight directions from the center of rotational symmetry as seen in a plan view, that is, has a shape of 8-fold rotational symmetry. While the present invention is not specified to the shape having 8-fold rotational symmetry as shown in FIG. 12, setting the light-emitting region to higher-order rotational symmetry (for example, equal to or greater than 4-fold rotational symmetry), the light passing through the substrate 10 becomes even.

[5] In the above-described <Exemplary Structure of Nitride Semiconductor Ultraviolet Light-Emitting Element> and <Exemplary Method for Manufacturing Nitride Semiconductor Ultraviolet Light-Emitting Element>, while the description has been given of the exemplary case where the side circumferential surfaces 111, 121 of the substrate 10 are entirely curved surfaces (spherical surfaces), a flat surface may be left at part of the side circumferential surfaces 111, 121 of the substrate 10. For example, the substrate 10 may have a shape obtained by ending the grinding process of the chip 40 in each of the state shown in FIGS. 8B to 8E. Further, the chip before being subjected to the grinding process may not be cubic, and the main surface of the chip before being subjected to the grinding process may not be square.

Note that, in order to cause light transmitting through the substrate to converge thereby effectively improving the light extraction efficiency, as shown in FIGS. 8B to 8F, at least four corners at each of the main surface 101 and the rear surface 102 of the substrate must be ground. In this case, firstly, as compared to the mode in which the substrate is quadrangular-shaped as seen in a plan view as shown in FIGS. 8B and 8C, the mode in which the substrate is circular-shaped (or oval-shaped) or quadrangular-shaped with four corners rounded as seen in a plan view as shown in FIGS. 8D to 8F is preferable, for its being capable of reducing loss of light at the side surface of the substrate (transmission of light at the side surface of the first portion 110, total reflection of light at the side surface of the second portion 120). Secondly, as shown in FIGS. 8B to 8E, as compared to the shape in which flat surfaces are left in the side surface of the substrate, the shape in which the flat surfaces are not left as shown in FIG. 8F is preferable for being capable of reducing loss of light at the side surface of the substrate (transmission of light at the side surface of the first portion 110, total reflection of light at the side surface of the second portion 120).

[6] While the above-described embodiment exemplarily shows the case where the p-type plated electrode 24 is film-like (see FIGS. 1 and 2 and others), the p-type plated electrode 24 may be structured by, for example, a multitude of bumps (projections) composed of, for example, Au. In this case, the surface area of the outermost surface of the element structure part 20 becomes greater and, therefore, bonding force improves in manufacturing the chip 40 as shown in FIG. 6.

[7] The above-described embodiment and variations can be embodied in any combination. Note that, in combining [1] and [2], in the case where the entire nitride semiconductor ultraviolet light-emitting element is to be sealed with the transmissive member 70, the reflective member 80 should be previously formed at the side circumferential surface 111 of the first portion 110 of the substrate 10, and thereafter the nitride semiconductor ultraviolet light-emitting element 1B (see FIG. 10) should be sealed with the transmissive member 70.

INDUSTRIAL APPLICABILITY

The present invention is applicable to a nitride semiconductor ultraviolet light-emitting element in which AlGaN-based semiconductor layers are formed on the main surface of a sapphire substrate and emitting light whose central emission wavelength is 365 nm or less (ultraviolet light), and a method for manufacturing the same.

DESCRIPTION OF SYMBOLS

1, 1A to 1C nitride semiconductor ultraviolet light-emitting element
10, 10C substrate
101 main surface
102 rear surface
110 first portion
111 side circumferential surface
120, 120C second portion
121, 121C side circumferential surface
20 element structure part
21, 21D AlGaN-based semiconductor layer
211 underlying layer
212 n-type cladding layer (n-type AlGaN)
213 active layer
214 electron block layer (p-type AlGaN)
215 p-type cladding layer (p-type AlGaN)
216 p-type contact layer (p-type GaN)
22, 22D p-electrode
23, 23D n-electrode
24 p-type plated electrode
25 n-type plated electrode
26 insulating film
31 light-emitting region
32 peripheral region
40 chip
50 protective member
60 grind-processing apparatus
61 side wall part
62 bottom part
63 rotation shaft
70 transmissive member
80 reflective member
L1 to L3 light beam

The invention claimed is:
1. A method for manufacturing a nitride semiconductor ultraviolet light-emitting element, comprising
a substrate processing step of subjecting a sapphire substrate of a chip to a grinding process, the chip including the sapphire substrate, and an element structure part including a plurality of AlGaN-based semiconductor layers stacked on a main surface of the substrate, the element structure part emitting light whose central emission wavelength is 365 nm or less upon energization, wherein
the substrate processing step is a step of performing a grinding process on at least four corners of the main surface and four corners of a rear surface being a surface opposite to the main surface, and
the grinding process step is a step of performing a grinding process on the substrate so as to leave a surface parallel to the main surface on the rear surface side.

2. The method for manufacturing a nitride semiconductor ultraviolet light-emitting element according to claim 1, wherein the grinding process step is a step of performing a grinding process on at least the four corners of the main surface and the four corners of the rear surface to each become a convex curved surface.

3. The method for manufacturing a nitride semiconductor ultraviolet light-emitting element according to claim 1, wherein the substrate processing step is a step of performing a grinding process on the substrate so that a shape of the substrate in a plan view as seen in a direction perpendicular to the main surface becomes one of a circle, an oval, and a quadrangle having four rounded corners.

4. The method for manufacturing a nitride semiconductor ultraviolet light-emitting element according to claim 1, wherein
the substrate processing step includes
a first step of forming a protective member on the chip so as to cover a surface of the element structure part,
a second step of performing a grinding process on the substrate of the chip provided with the protective member, and
a third step of removing the protective member after the second step.

5. The method for manufacturing a nitride semiconductor ultraviolet light-emitting element according to claim 4, wherein, in the second step, in a container having a concave curved surface to which abrasive grains are attached, at least one piece of the chip is caused to roll so as to collide with the concave curved surface.

6. The method for manufacturing a nitride semiconductor ultraviolet light-emitting element according to claim 5, wherein, before the second step is performed, when a length of one side of the main surface of the substrate being square is L, and a diameter of a circumcircle of the element structure part is R, a thickness D of the substrate satisfies:

$$D \le 2 \times \sqrt{\left(\frac{L}{2}\right)^2 - \left(\frac{R}{2}\right)^2}.$$

7. The method for manufacturing a nitride semiconductor ultraviolet light-emitting element according to claim 4, wherein, in the third step, the protective member is removed by being dissolved in a solvent.

8. The method for manufacturing a nitride semiconductor ultraviolet light-emitting element according to claim 1, further comprising a transmissive member forming step of forming, on at least part of or an entire surface exposed at the four corners of the rear surface of the substrate by the grinding process in the substrate processing step, a transmissive member having an outermost surface composed of amorphous fluororesin and transmitting light emitted from the element structure part.

9. The method for manufacturing a nitride semiconductor ultraviolet light-emitting element according to claim 8, wherein
the substrate processing step is a step of performing a grinding process on the four corners of the rear surface so as to leave part of the rear surface being parallel to the main surface and flat, and
the transmissive member forming step includes a step of forming an antireflection layer on at least the rear surface, and a step of forming the amorphous fluororesin on a surface of the antireflection layer.

10. The method for manufacturing a nitride semiconductor ultraviolet light-emitting element according to claim 1, further comprising a reflective member forming step of forming, on at least the surface exposed at the four corners of the main surface of the substrate by the grinding process in the substrate processing step, a reflective member reflecting light emitted from the element structure part.

11. A nitride semiconductor ultraviolet light-emitting element, comprising:
a sapphire substrate; and
an element structure part including a plurality of AlGaN-based semiconductor layers stacked on a main surface of the substrate, the element structure part emitting light whose central emission wavelength is 365 nm or less upon energization, wherein, in the substrate,
in a first portion extending from the main surface by a first distance, a sectional area of a cross section parallel to the main surface continuously increases with distance from the main surface,
in a second portion extending from a side opposite to the main surface by a second distance, a sectional area of a cross section parallel to the main surface continuously increases with distance from the side opposite to the main surface, and
a sum of the first distance and the second distance is equal to or less than a thickness of the substrate, and wherein,
on the side opposite to the main surface of the substrate, a surface parallel to the main surface exists, and
a shape of the substrate is one of a circle, an oval, and a quadrangle having four rounded corners in a plan view as seen in a direction perpendicular to the main surface, wherein
in the first portion, a unit increase amount of the sectional area of the cross section parallel to the main surface at a unit distance in a direction distancing from the main surface continuously reduces with distance from the main surface, and
in the second portion, a unit increase amount of the sectional area of the cross section parallel to the main surface at a unit distance in a direction distancing from the main surface continuously reduces with distance from the side opposite to the main surface.

12. The nitride semiconductor ultraviolet light-emitting element according to claim 11, wherein a reflective member reflecting light emitted from the element structure part is formed on at least part of a side circumferential surface of the first portion of the substrate.

13. A nitride semiconductor ultraviolet light-emitting element, comprising:
a sapphire substrate; and
an element structure part including a plurality of AlGaN-based semiconductor layers stacked on a main surface of the substrate, the element structure part emitting light whose central emission wavelength is 365 nm or less upon energization, wherein, in the substrate,
in a first portion extending from the main surface by a first distance, a sectional area of a cross section parallel to the main surface continuously increases with distance from the main surface,
in a second portion extending from a side opposite to the main surface by a second distance, a sectional area of a cross section parallel to the main surface continuously increases with distance from the side opposite to the main surface, and
a sum of the first distance and the second distance is equal to or less than a thickness of the substrate, and wherein,
on the side opposite to the main surface of the substrate, a surface parallel to the main surface exists, and
a shape of the substrate is one of a circle, an oval, and a quadrangle having four rounded corners in a plan view as seen in a direction perpendicular to the main surface, wherein, a transmissive member having an outermost surface composed of amorphous fluororesin and transmitting light emitted from the element structure part is formed on at least part of or an entire side circumferential surface of the second portion of the substrate.

14. The nitride semiconductor ultraviolet light-emitting element according to claim 13, wherein
- a rear surface being a flat surface parallel to the main surface exists on the side opposite to the main surface of the substrate, the transmissive member being formed on part of or the entire rear surface, and
- the transmissive member includes an antireflection layer formed on at least the rear surface.

15. The nitride semiconductor ultraviolet light-emitting element according to claim 13, wherein a reflective member reflecting light emitted from the element structure part is formed on at least part of a side circumferential surface of the first portion of the substrate.

* * * * *